(12) United States Patent
Fujiwara et al.

(10) Patent No.: US 9,455,117 B2
(45) Date of Patent: Sep. 27, 2016

(54) ANALYTICAL CELL

(71) Applicant: HONDA MOTOR CO., LTD., Minato-Ku, Tokyo (JP)

(72) Inventors: Yoshiya Fujiwara, Wako (JP); Nariaki Kuriyama, Wako (JP); Takanori Maebashi, Wako (JP); Mitsumoto Kawai, Wako (JP)

(73) Assignee: Honda Motor Co., Ltd., Tokyo (JP)

( * ) Notice: Subject to any disclaimer, the term of this patent is extended or adjusted under 35 U.S.C. 154(b) by 0 days.

(21) Appl. No.: 14/828,717

(22) Filed: Aug. 18, 2015

(65) Prior Publication Data

US 2016/0056013 A1 Feb. 25, 2016

(30) Foreign Application Priority Data

Aug. 19, 2014 (JP) ................. 2014-166794

(51) Int. Cl.
*H01J 37/20* (2006.01)
(52) U.S. Cl.
CPC ........ *H01J 37/20* (2013.01); *H01J 2237/2007* (2013.01); *H01J 2237/2602* (2013.01)
(58) Field of Classification Search
USPC ................ 205/440.11, 441.11, 442.11, 443.1
See application file for complete search history.

(56) References Cited

U.S. PATENT DOCUMENTS

| | | | |
|---|---|---|---|
| 8,872,129 B2 | 10/2014 | Damiano, Jr. et al. | |
| 9,194,839 B2 * | 11/2015 | Kuriyama | ............ G01N 27/404 |
| 2015/0294835 A1* | 10/2015 | Kuriyama | ............... H01J 37/20 |
| | | | 250/440.11 |

FOREIGN PATENT DOCUMENTS

WO 2008/141147 A1 11/2008

OTHER PUBLICATIONS

Unocic et al., "In-Situ Electron Microscopy of Electrical Energy Storage Materials", Annual Merit Review, DOE Vehicle Technologies Program, Washington, DC, May 9-13, 2011 [online], 2014, Retrieved on Jan. 30, 2014 from the Internet <URL: http://www1.eere.energy.gov/vehiclesandfuels/pdfs/merit_review_2011/electrochemical_storage/es095_unocic_2011_o.pdf>.

* cited by examiner

*Primary Examiner* — Nicole Ippolito

(74) *Attorney, Agent, or Firm* — Carrier Blackman & Associates, P.C.; Joseph P. Carrier; William D. Blackman

(57) ABSTRACT

An analytical cell includes a first holder and a second holder. The first holder and the second holder each contain a substrate including a through-hole and a transmission membrane having an electron beam permeability. The through-hole is covered with the transmission membrane. The first holder and the second holder are stacked to form an overlapping portion such that the transmission membranes face toward each other. A negative electrode active material and a positive electrode active material, which are arranged at a distance from each other and are in contact, respectively, with an electrolytic solution, are connected electrically to a negative electrode collector and a positive electrode collector, respectively, in the overlapping portion. A lyophobic part having no affinity for the electrolytic solution is formed on at least one of the negative electrode collector and the positive electrode collector.

4 Claims, 39 Drawing Sheets

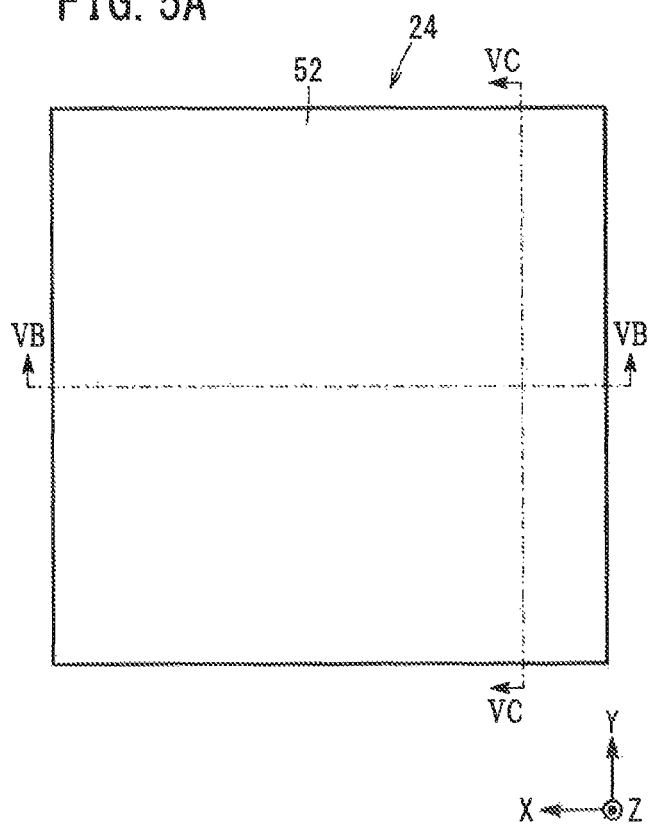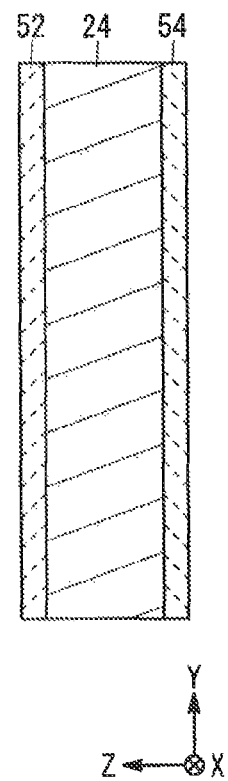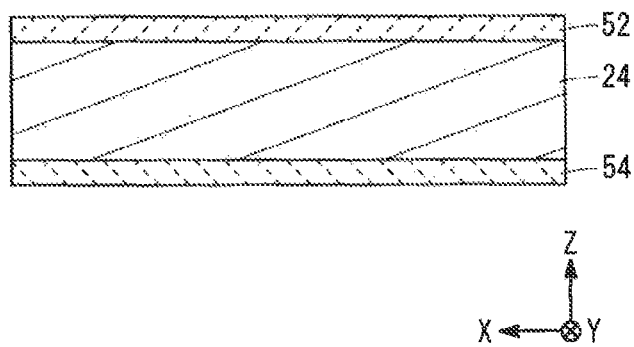

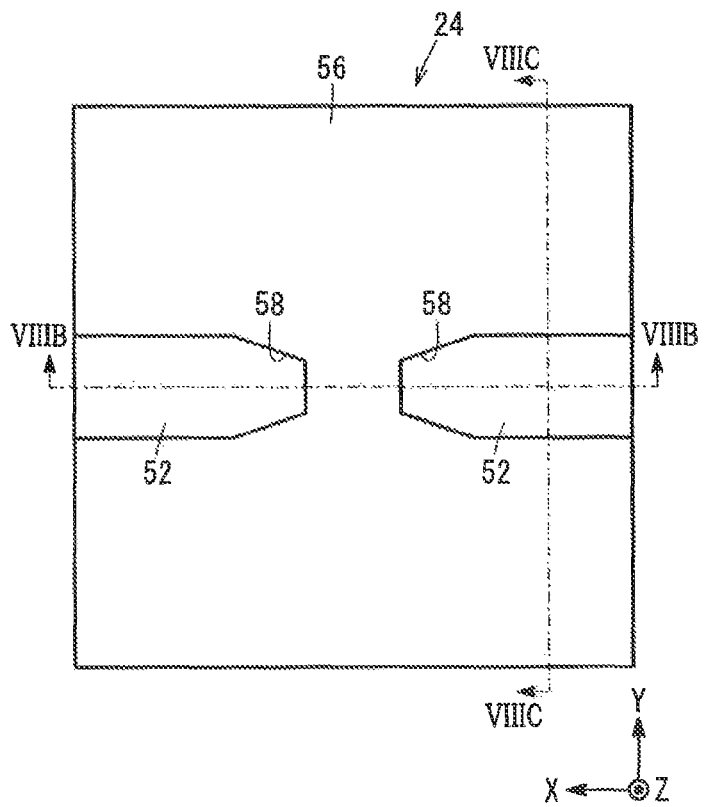
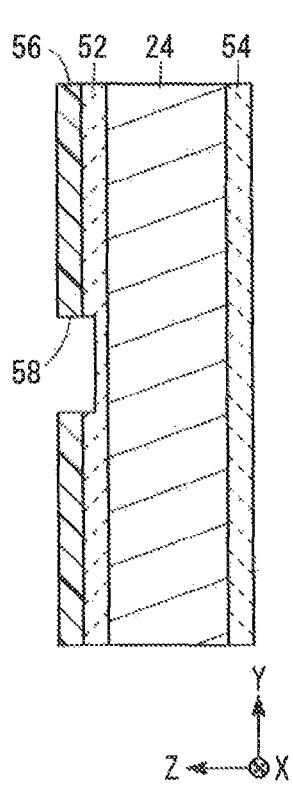
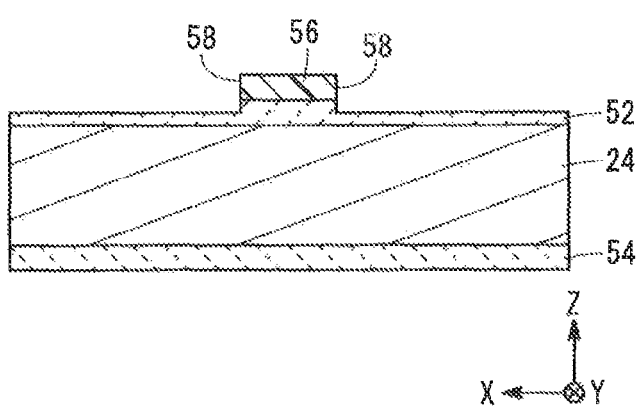

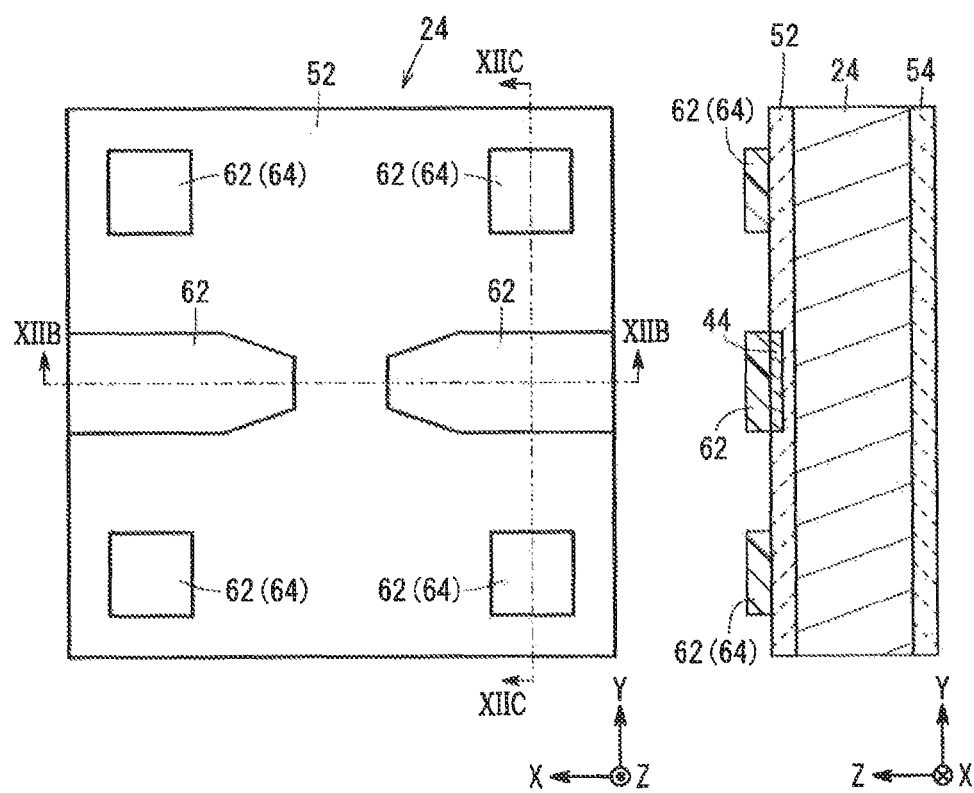
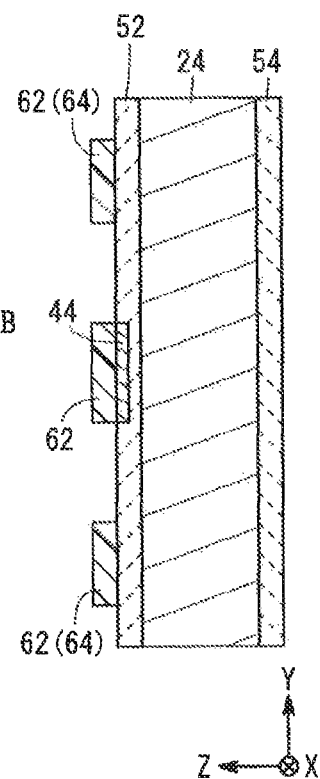
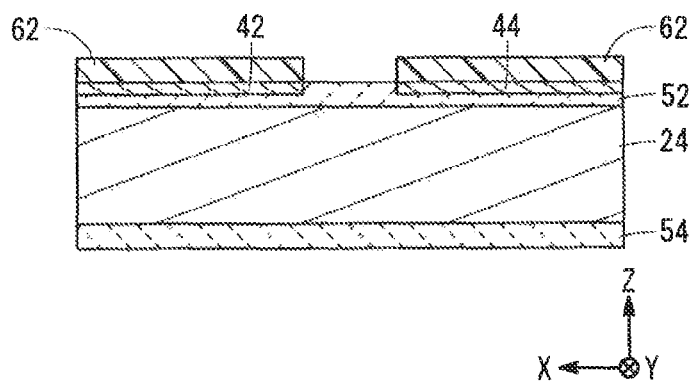

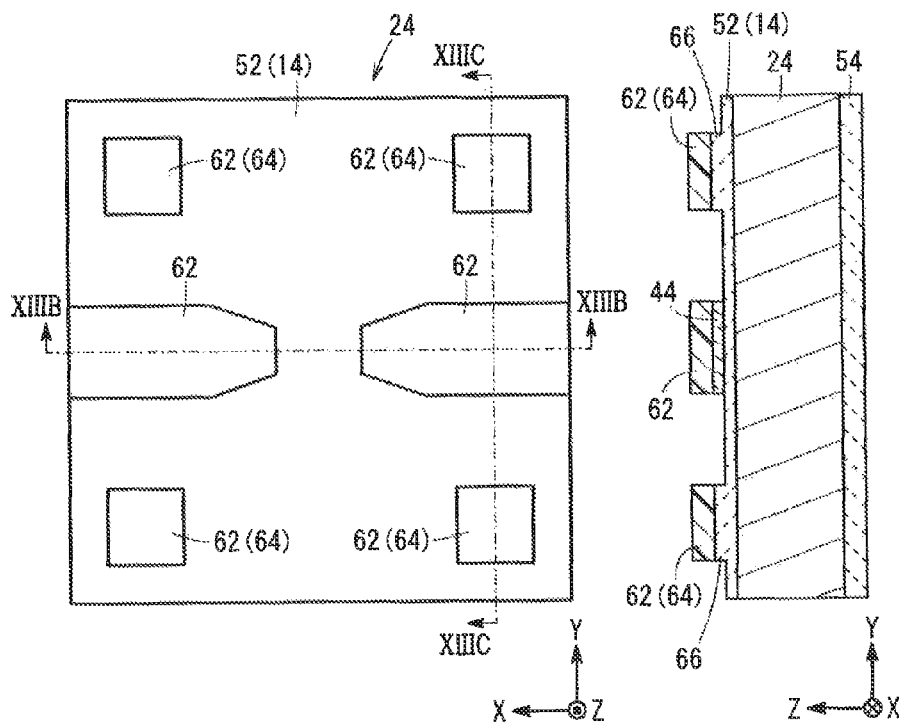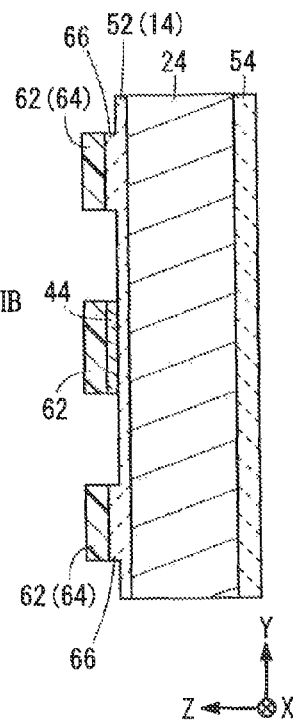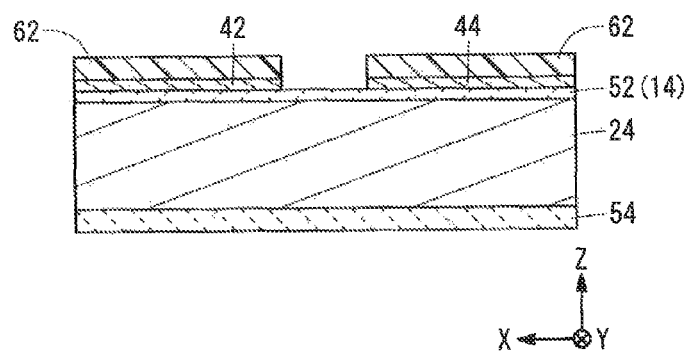

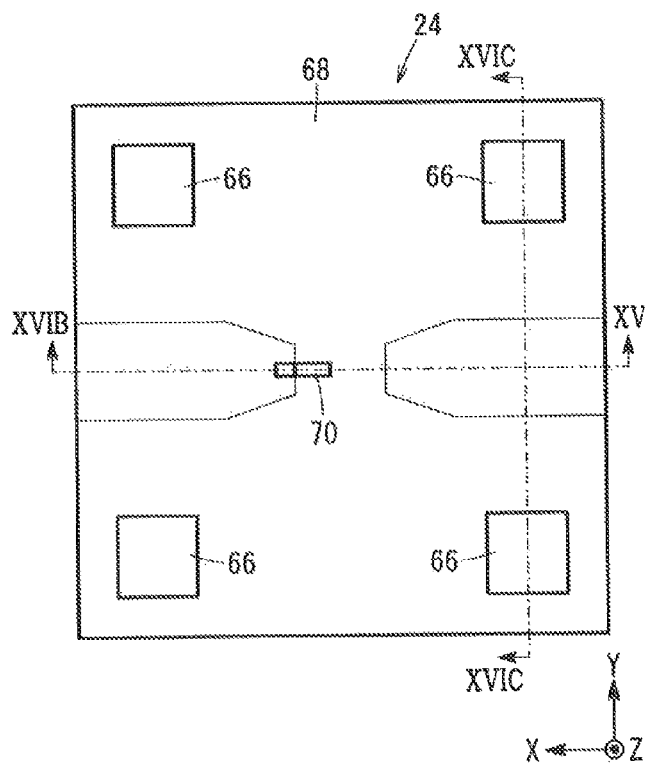
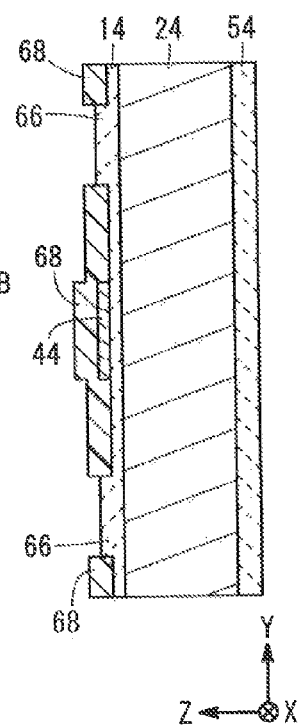
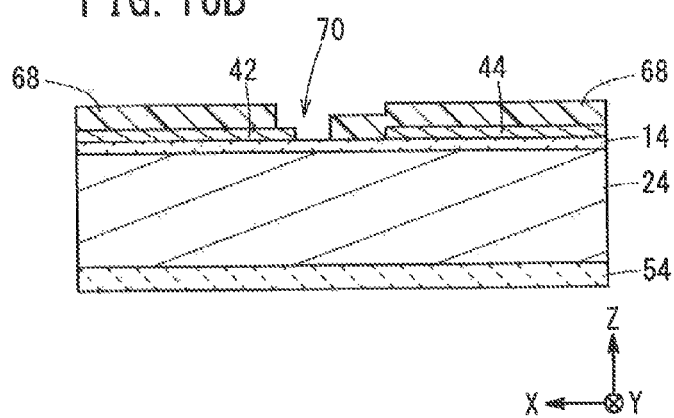

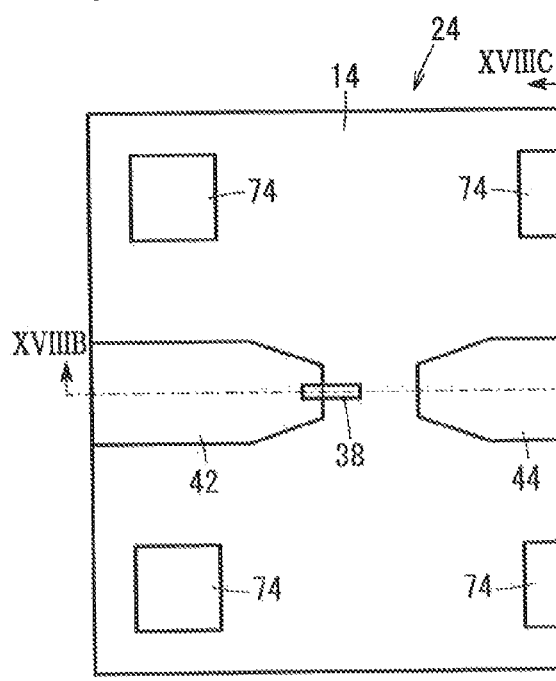
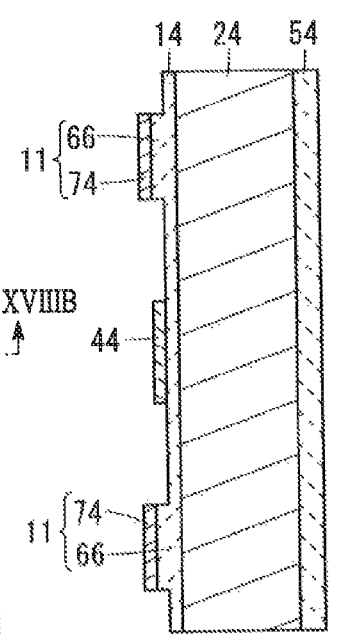
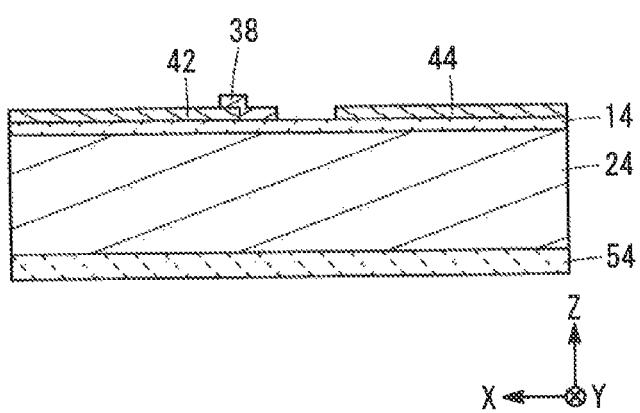

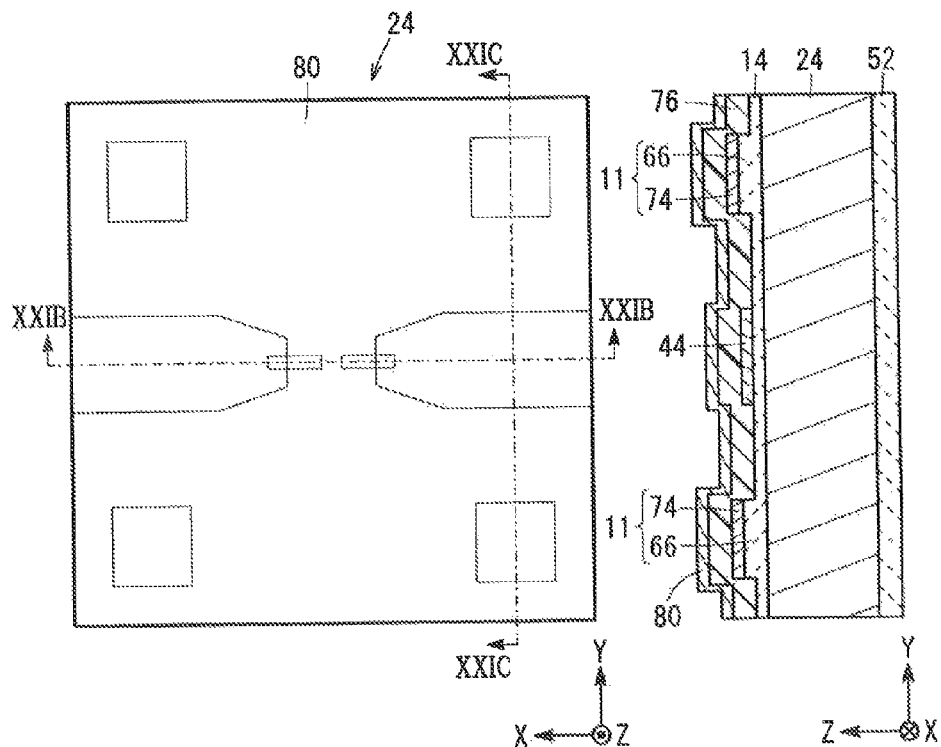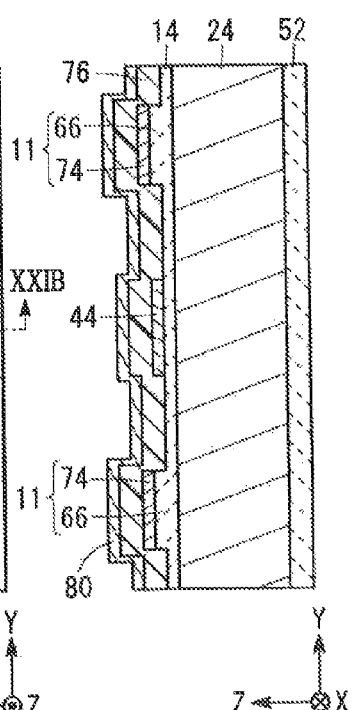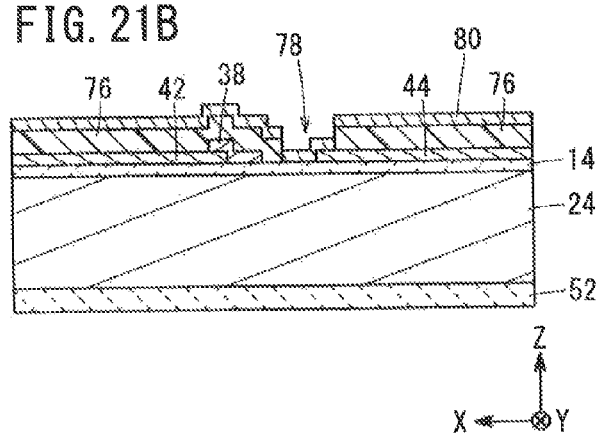

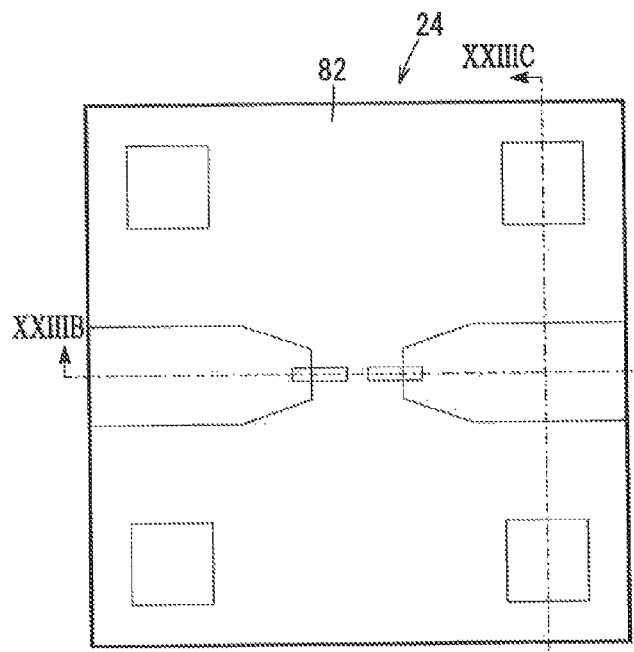
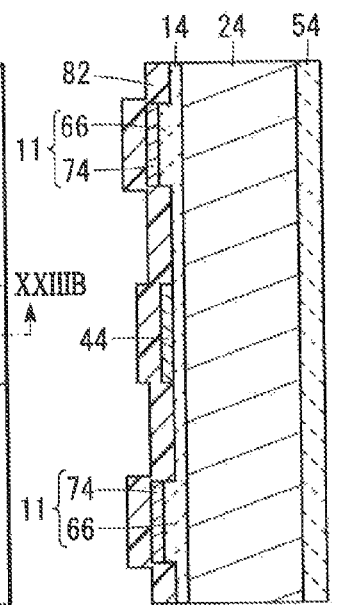
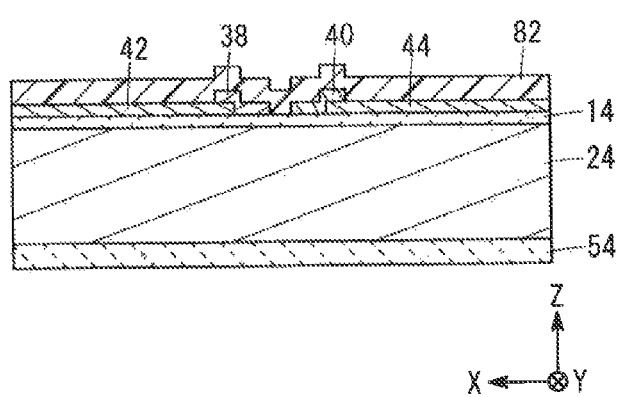

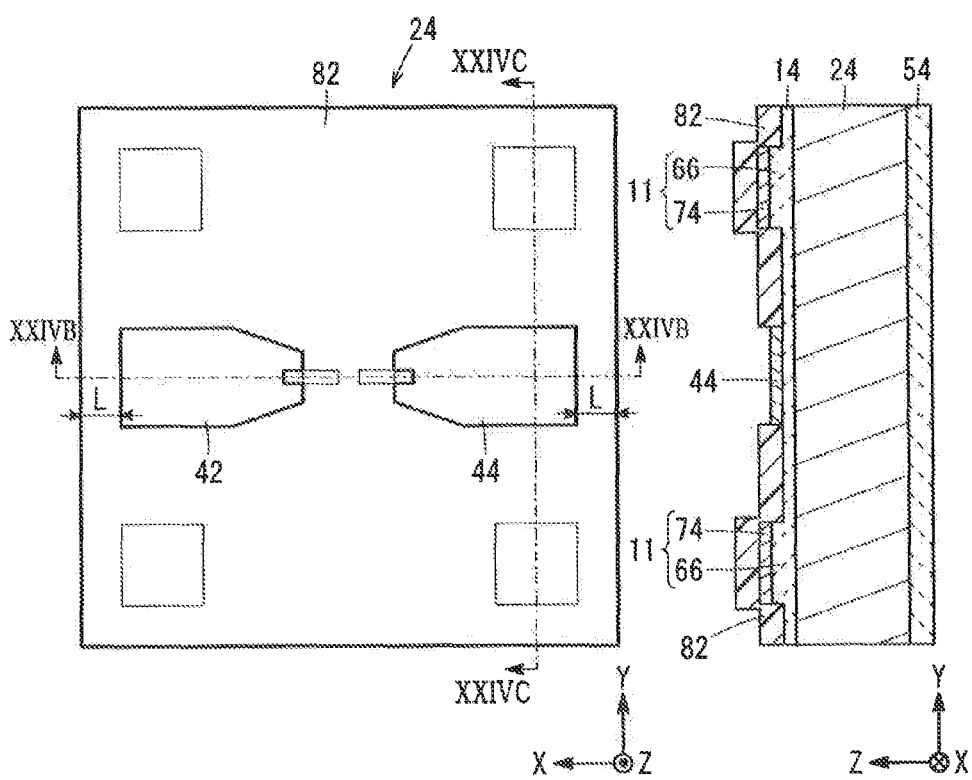
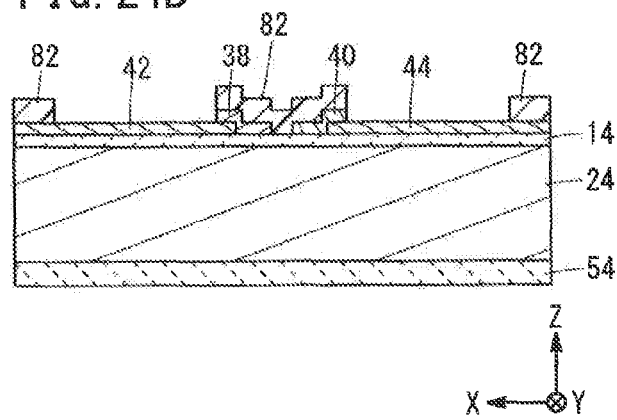

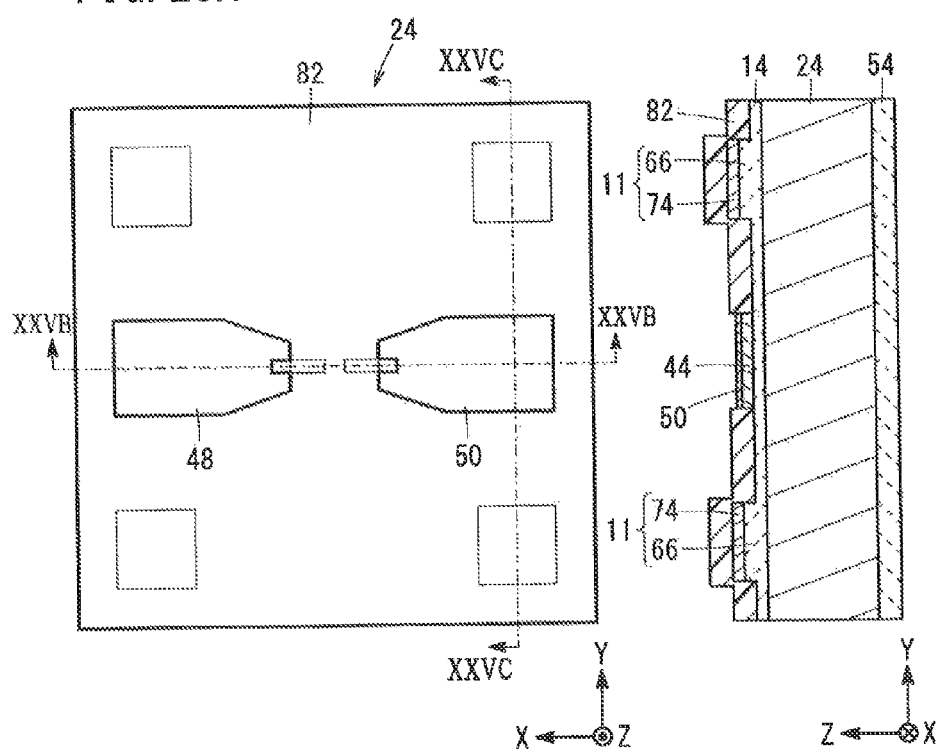
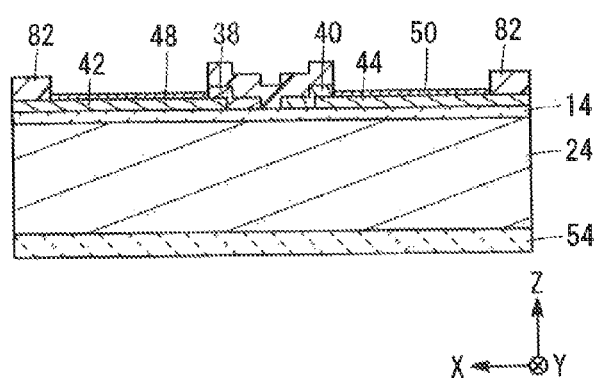

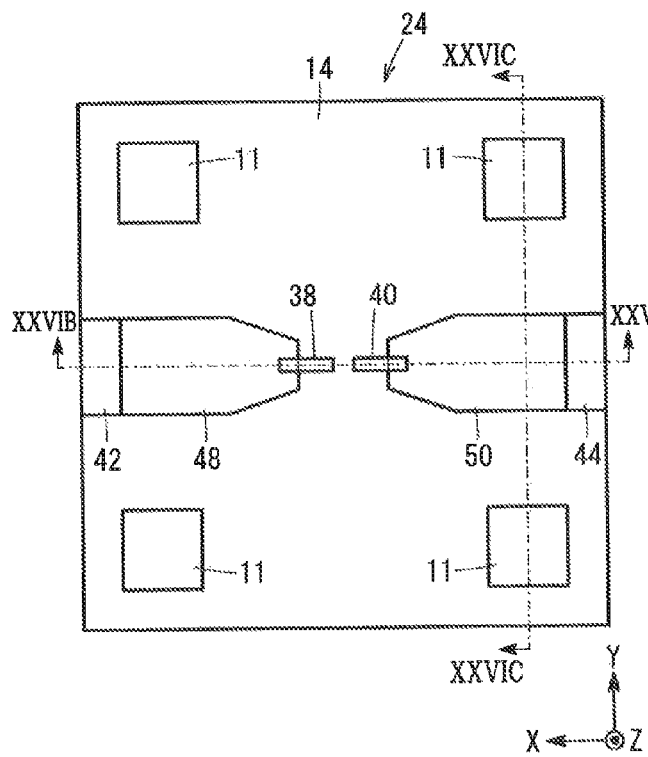
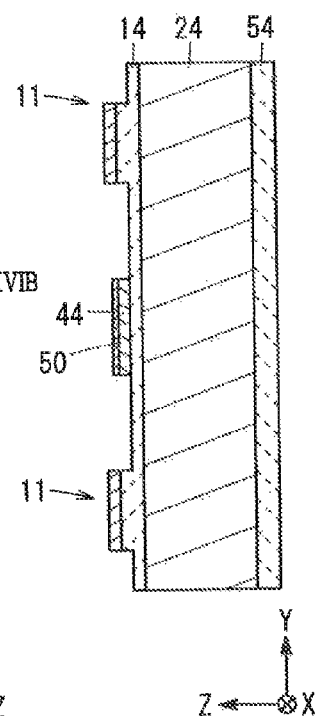
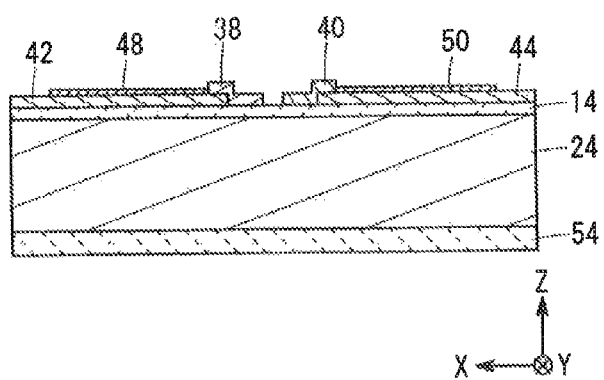

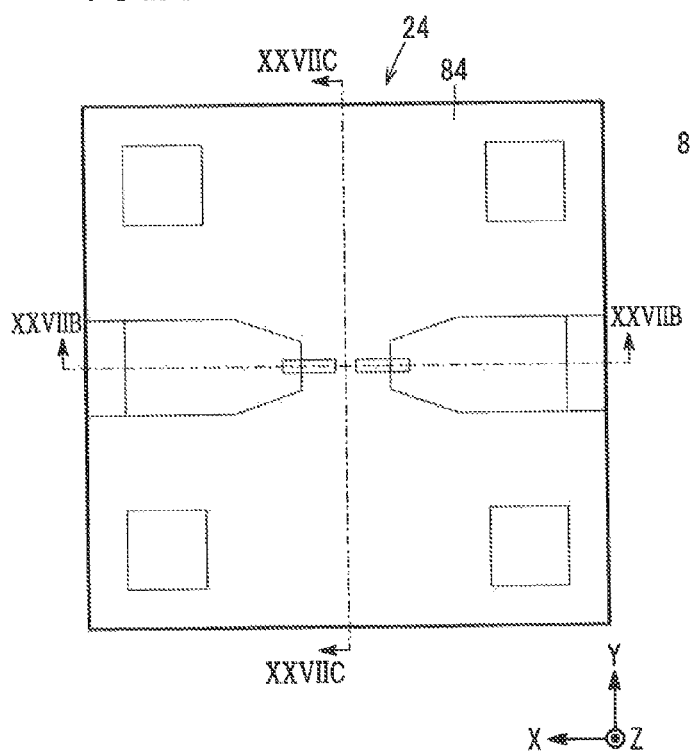
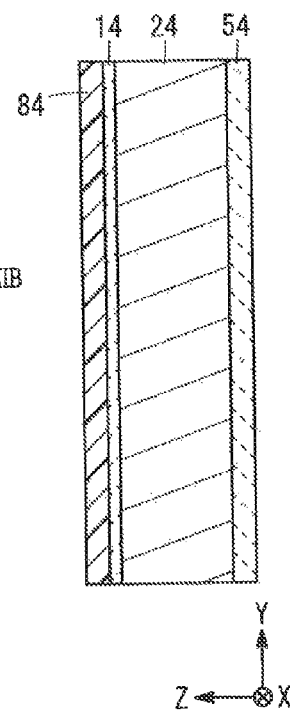
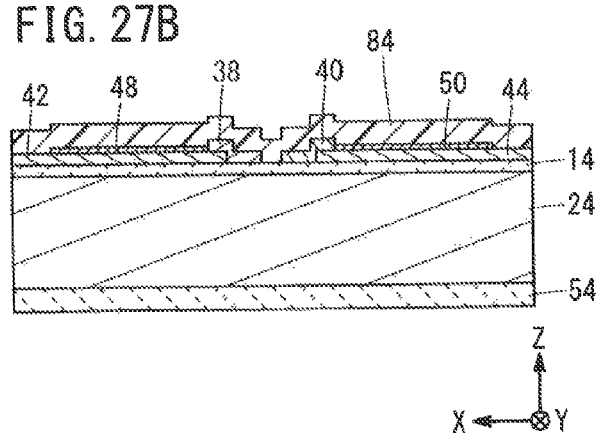

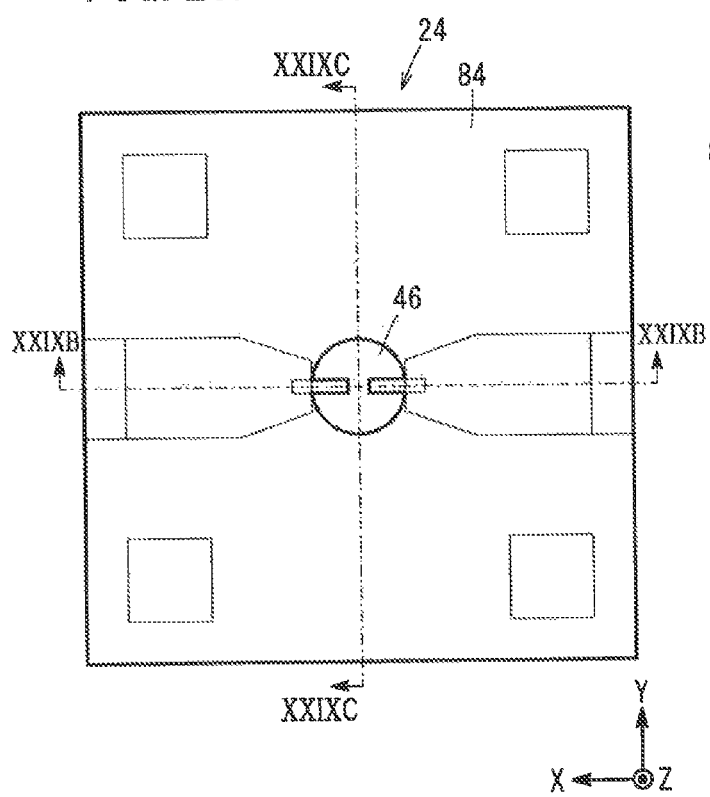
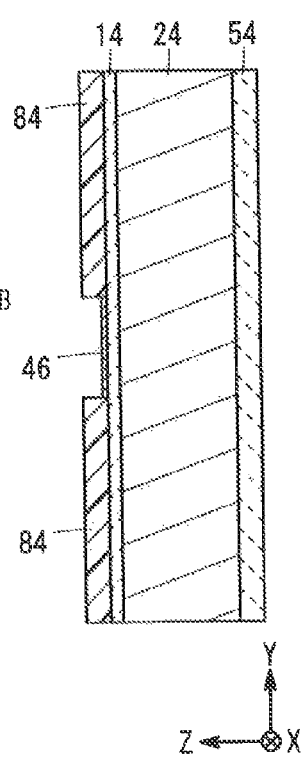
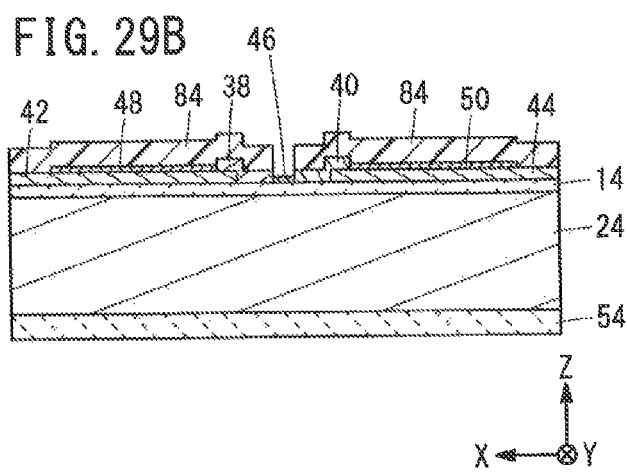

FIG. 31A
FIG. 31C
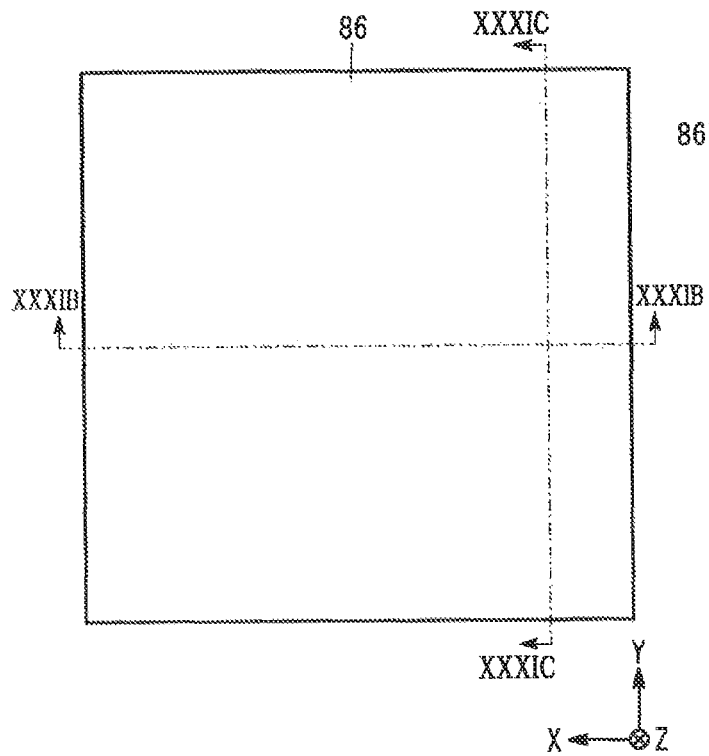
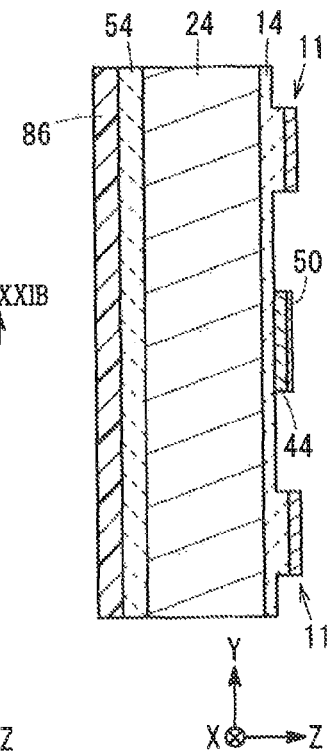
FIG. 31B
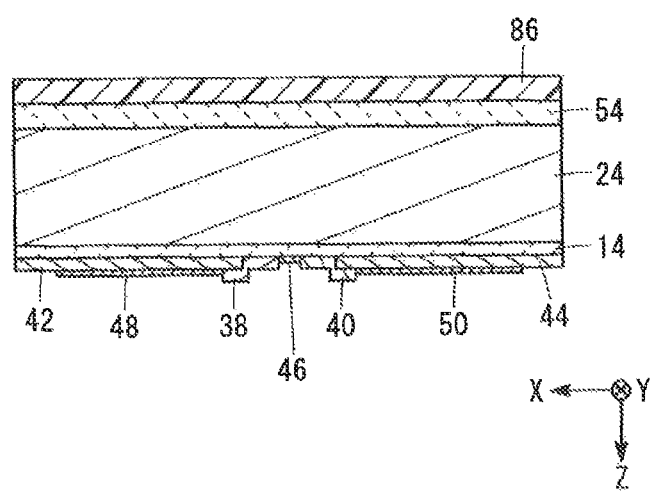

FIG. 33A
FIG. 33C
FIG. 33B
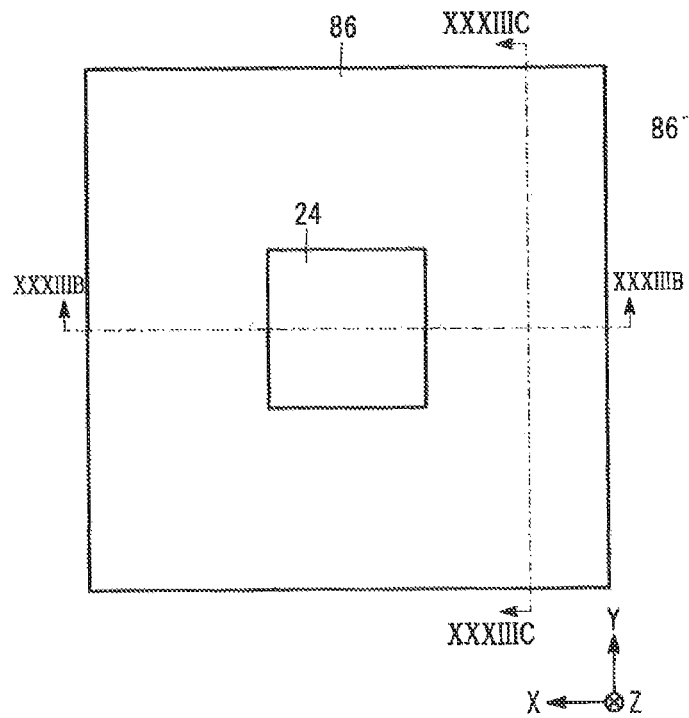
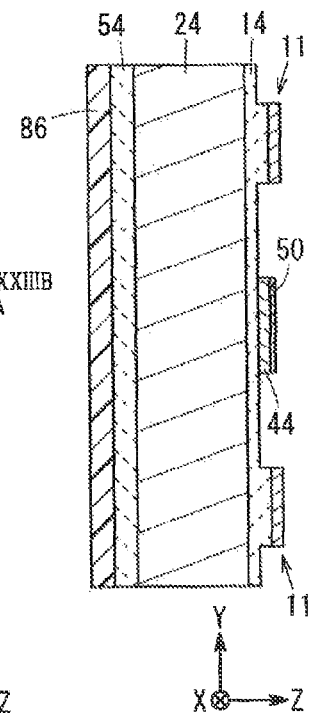
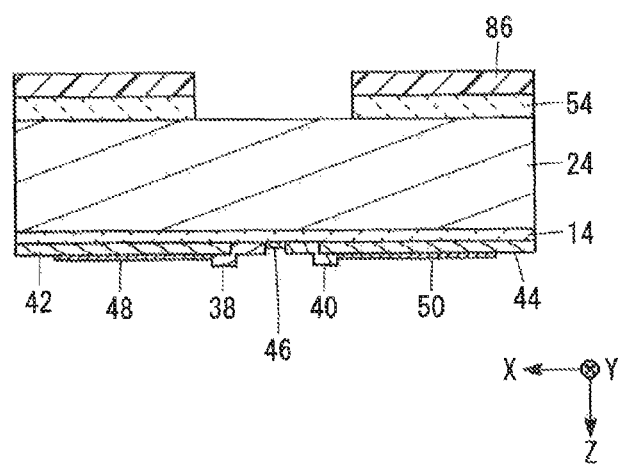

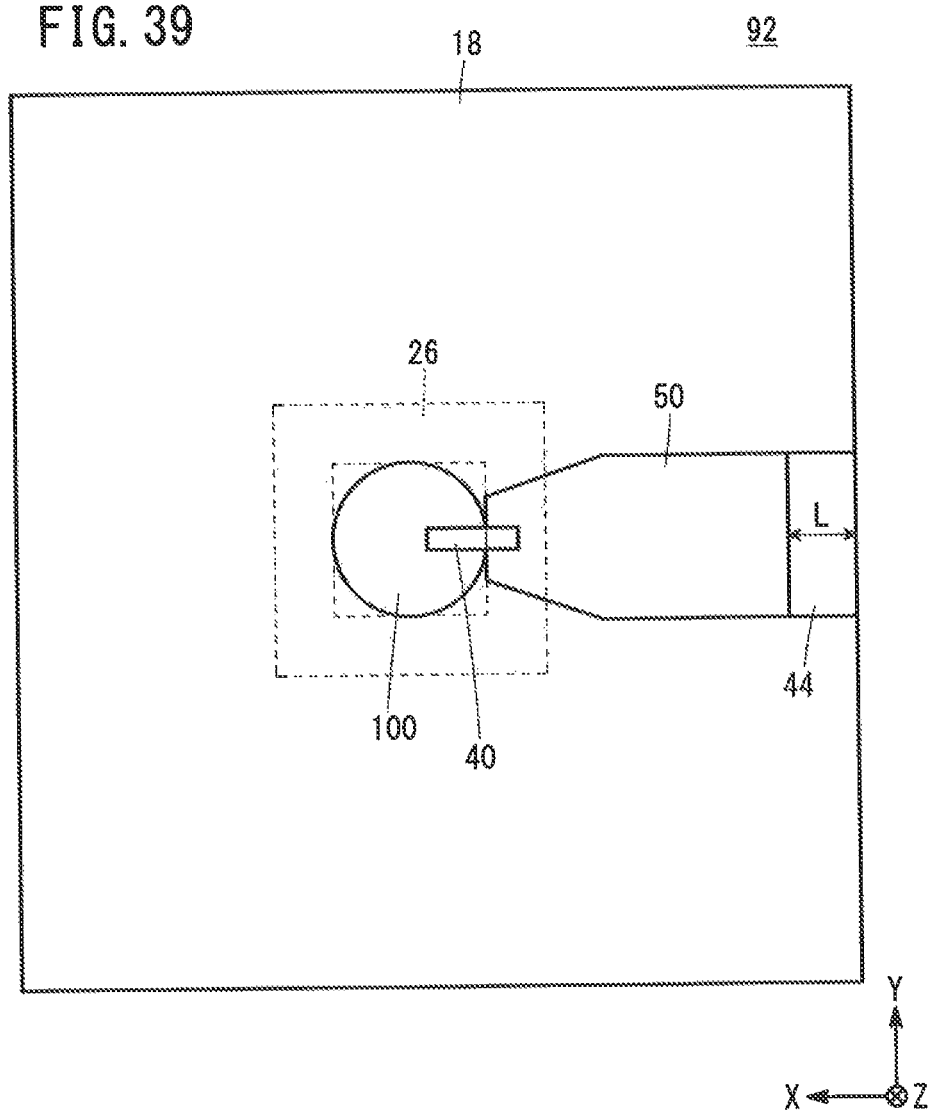

ANALYTICAL CELL

CROSS-REFERENCE TO RELATED APPLICATION

This application is based upon and claims the benefit of priority from Japanese Patent Application No. 2014-166794 filed on Aug. 19, 2014, the contents of which are incorporated herein by reference.

BACKGROUND OF THE INVENTION

1. Field of the Invention

The present invention relates to an analytical cell suitable for use, for example, in performing an electrode reaction analysis in relation to analytical equipment.

2. Description of the Related Art

As is well known, in an electric cell, a negative electrode active material and a positive electrode active material undergo electrode reactions in a charge-discharge process. In recent years, such electrode reactions have been analyzed during the charge-discharge process using analytical equipment. For example, an analytical cell, which can be observed by a transmission electron microscope (TEM), has been proposed in In-situ Electron Microscopy of Electrical Energy Storage Materials [online], 2014, retrieved from the Internet on Jan. 30, 2014 <URL: http://www1.eere.energy.gov/vehiclesandfuels/pdfs/merit_review_2011/electrochemical_storage/es095_unocic_2011_o.pdf>.

Such an analytical cell contains a pair of silicon substrates, each of which includes a rectangular observation window having a size of about 50 μm×100 μm. The silicon substrates are stacked at a predetermined distance from each other to form an overlapping portion, in such a manner that the observation windows face toward each other. A negative electrode active material containing highly oriented graphite, and a positive electrode active material containing $LiCoO_2$ are deposited on one of the silicon substrates by an ion beam deposition method, so that the negative electrode active material and the positive electrode active material are located between the observation windows. Incidentally, the negative electrode active material and the positive electrode active material are each extracted from a bulk body using a focused ion beam (FIB).

The negative electrode active material and the positive electrode active material (hereinafter also referred to simply as active materials) are connected electrically to a negative electrode collector and a positive electrode collector (hereinafter also referred to simply as collectors), respectively, in the overlapping portion. The collectors extend respectively from inside of the overlapping portion and are exposed to the outside. Therefore, the active materials can be connected electrically to the exterior of the overlapping portion by the collectors.

Electrode reactions and the like of the active materials can be analyzed by observing the analytical cell using the transmission electron microscope (TEM). More specifically, at first, the analytical cell is placed in one end of a TEM holder having a passage for introduction of an electrolytic solution to the overlapping portion. Then, the electrolytic solution is introduced from the passage of the TEM holder into the overlapping portion, and the collectors are each connected to a charge-discharge tester or the like, whereby the active materials undergo electrode reactions. TEM observation is carried out while transmitting an electron beam through the observation window in order to analyze the electrode reactions of the active materials.

SUMMARY OF THE INVENTION

In the above-described analytical cell, the electrolytic solution is introduced into the overlapping portion, whereby the active materials are brought into contact with the electrolytic solution in order to carry out the electrode reactions. In this process, portions of the collectors located in the overlapping portion also are brought into contact with the electrolytic solution. Therefore, a side reaction, which is different from the electrode reactions of the active materials, may be caused on the collector surfaces that are in contact with the electrolytic solution, and a product of the side reaction may become attached to the collector surfaces. In this case, the electrolytic solution or a supporting salt contained therein may be consumed in the side reaction, and the electrode reactions may be inhibited.

In particular, the volume of the active materials and the surface area of the active materials (relative to that of the collectors) are significantly smaller in the analytical cell than in common electric cells and the like. Therefore, in the case that currents are generated in both of the electrode reactions and the side reaction, it is difficult to selectively analyze only the current generated in the electrode reactions.

Thus, in the case that the side reaction is caused on collector surfaces that are in contact with the electrolytic solution, it is difficult to accurately observe the electrode reactions of the analysis subjects.

A principal object of the present invention is to provide an analytical cell capable of inhibiting or suppressing side reactions on a negative electrode collector and a positive electrode collector, thereby enabling highly accurate analysis of electrode reactions of a negative electrode active material and a positive electrode active material.

According to an aspect of the present invention, there is provided an analytical cell through which an electron beam is transmitted to perform an analysis, comprising a first holder and a second holder stacked with an electrolytic solution interposed therebetween, wherein:

the first holder and the second holder each contain a substrate including a through-hole and a transmission membrane having an electron beam permeability, the through-hole extends in a thickness direction of the substrate, and the transmission membrane is disposed on one surface of the substrate such that one end of the through-hole is covered with the transmission membrane;

the first holder and the second holder are stacked to form an overlapping portion such that the surfaces of the substrates with the transmission membranes formed thereon face toward each other;

in the overlapping portion, an inner space containing the electrolytic solution is sealed, and the through-holes face toward each other across the transmission membranes in order to form an observation window through which an electron beam is transmitted;

a negative electrode active material and a positive electrode active material are arranged at a distance from each other and are in contact, respectively, with the electrolytic solution between the transmission membranes in the observation window;

the negative electrode active material and the positive electrode active material are connected electrically to a negative electrode collector and a positive electrode collector, respectively, in the overlapping portion;

the negative electrode collector and the positive electrode collector each extend from inside of the overlapping portion and are exposed to outside; and a lyophobic part having no affinity for the electrolytic solution is formed on at least one of the negative electrode collector and the positive electrode collector.

In the analytical cell according to the present invention, as described above, the lyophobic part is formed on at least one of the negative electrode collector and the positive electrode collector. The lyophobic part can be formed by subjecting a collector surface to a lyophobization treatment. The electrolytic solution exhibits a larger contact angle on the collector surface with the lyophobic part than without it. In other words, the electrolytic solution exhibits a smaller contact area on the collector surface with the lyophobic part. Thus, the electrolytic solution hardly comes into contact with the lyophobic part in the overlapping portion.

Therefore, side reactions, which are different from analysis subject electrode reactions, can be inhibited on the collector surface, and products of such side reactions can be prevented from becoming attached to the collector surface. Thus, the electrolytic solution or a supporting salt contained therein can be prevented from being consumed in the side reactions, and the electrode reactions can be carried out effectively. In addition, because such side reactions can be inhibited, currents generated in the side reactions can be reduced, and currents generated in the electrode reactions can easily be analyzed.

Consequently, the electrode reactions can be analyzed with high accuracy by observing the analytical cell while the electron beam is transmitted through the observation window.

In the above analytical cell, the negative electrode active material, the negative electrode collector, the positive electrode active material, and the positive electrode collector may all be formed on the transmission membrane in the first holder. In this case, during production of the analytical cell, the steps of forming the collectors and of forming the lyophobic part thereon can be carried out using only the first holder. Therefore, the analytical cell can be obtained easily and efficiently using a simple production process.

In the above analytical cell, the negative electrode active material and the negative electrode collector may be formed on the transmission membrane in the first holder, and the positive electrode active material and the positive electrode collector may be formed on the transmission membrane in the second holder. In this case, the negative electrode active material and the positive electrode active material are formed on each of the first holder and the second holder, respectively. Therefore, even if the negative electrode active material and the positive electrode active material are disposed in a small space, the negative electrode active material and the positive electrode active material are not arranged excessively close to each other, and can be kept out of contact with each other. Consequently, the negative electrode active material and the positive electrode active material can be effectively prevented from short-circuiting.

In the above analytical cell, preferably, a lyophilic part having an affinity for the electrolytic solution is formed in vicinity of at least one of the negative electrode active material and the positive electrode active material on a surface in contact with the electrolytic solution of the transmission membrane. The lyophilic part can be formed by subjecting a transmission membrane surface to a lyophilization treatment. The electrolytic solution exhibits a smaller contact angle on the transmission membrane surface with the lyophilic part than without it. In other words, the electrolytic solution exhibits a larger contact area on the transmission membrane surface with the lyophilic part. Thus, the electrolytic solution can more easily be located in the vicinity of the active material in the overlapping portion. Consequently, the electrode reactions, which are the subject of analysis, can more effectively be carried out and analyzed with high accuracy.

The above and other objects, features and advantages of the present invention will become more apparent from the following description when taken in conjunction with the accompanying drawings in which a preferred embodiment of the present invention is shown by way of illustrative example.

BRIEF DESCRIPTION OF THE DRAWINGS

FIG. 5A is a plan view of a transmission membrane precursor side of a substrate with a transmission membrane precursor formed on one surface and a covering membrane precursor formed on another surface thereof; FIG. 5B is a cross-sectional view taken along line VB-VB of FIG. 5A in the direction of the arrows; and FIG. 5C is a cross-sectional view taken along line VC-VC of FIG. 5A in the direction of the arrows;

FIG. 8A is a plan view of thinned portions in the transmission membrane precursor corresponding to the collector-shaped portions of FIG. 7A; FIG. 8B is a cross-sectional view taken along line VIIIB-VIIIB of FIG. 8A in the direction of the arrows; and FIG. 8C is a cross-sectional view taken along line VIIIC-VIIIC of FIG. 8A in the direction of the arrows;

FIG. 12A is a plan view of photoresist residues remaining only on the negative electrode collector, the positive electrode collector, and portions corresponding to spacers formed by patterning the photoresist of FIG. 11A; FIG. 12B is a cross-sectional view taken along line XIIB-XIIB of FIG. 12A in the direction of the arrows; and FIG. 12C is a cross-sectional view taken along line XIIC-XIIC of FIG. 12A in the direction of the arrows;

FIG. 13A is a plan view of a transmission membrane formed by thinning the exposed portions of the transmission membrane precursor around the photoresist residues of FIG. 12A; FIG. 13B is a cross-sectional view taken along line XIIIB-XIIIB of FIG. 13A in the direction of the arrows; and FIG. 13C is a cross-sectional view taken along line XIIIC-XIIIC of FIG. 13A in the direction of the arrows;

FIG. 16A is a plan view of a negative electrode active material formation portion (formed on the transmission membrane and the negative electrode collector) and the first spacer-shaped portions exposed by patterning the photoresist of FIG. 15A; FIG. 16B is a cross-sectional view taken along line XVIB-XVIB of FIG. 16A in the direction of the arrows; and FIG. 16C is a cross-sectional view taken along line XVIC-XVIC of FIG. 16A in the direction of the arrows;

FIG. 18A is a plan view of a negative electrode active material and second spacer-shaped portions obtained by removing the photoresist of FIG. 17A; FIG. 18B is a cross-sectional view taken along line XVIIIB-XVIIIB of FIG. 18A in the direction of the arrows; and FIG. 18C is a cross-sectional view taken along line XVIIIC-XVIIIC of FIG. 18A in the direction of the arrows;

FIG. 21A is a plan view of a positive electrode active material precursor formed on the one surface of the substrate of FIG. 20A; FIG. 21B is a cross-sectional view taken along line XXIB-XXIB of FIG. 21A in the direction of the arrows; and FIG. 21C is a cross-sectional view taken along line XXIC-XXIC of FIG. 21A in the direction of the arrows;

FIG. 23A is a plan view of a photoresist formed on the one surface of the substrate of FIG. 22A; FIG. 23B is a cross-sectional view taken along line XXIIIB-XXIIIB of FIG. 23A in the direction of the arrows; and FIG. 23C is a cross-sectional view taken along line XXIIIC-XXIIIC of FIG. 23A in the direction of the arrows;

FIG. 24A is a plan view of lyophobic part formation portions (formed on the positive electrode collector and the negative electrode collector) exposed by patterning the photoresist of FIG. 23A; FIG. 24B is a cross-sectional view taken along line XXIVB-XXIVB of FIG. 24A in the direction of the arrows; and FIG. 24C is a cross-sectional view taken along line XXIVC-XXIVC of FIG. 24A in the direction of the arrows;

FIG. 25A is a plan view of lyophobic parts formed by subjecting the exposed portions of FIG. 24A to a lyophobization treatment; FIG. 25B is a cross-sectional view taken along line XXVB-XXVB of FIG. 25A in the direction of the arrows; and FIG. 25C is a cross-sectional view taken along line XXVC-XXVC of FIG. 25A in the direction of the arrows;

FIG. 26A is a plan view of a resultant product obtained by removing the photoresist of FIG. 25A; FIG. 26B is a cross-sectional view taken along line XXVIB-XXVIB of FIG. 26A in the direction of the arrows; and FIG. 26C is a cross-sectional view taken along line XXVIC-XXVIC of FIG. 26A in the direction of the arrows;

FIG. 27A is a plan view of a photoresist formed on the one surface of the substrate of FIG. 26A; FIG. 27B is a cross-sectional view taken along line XXVIIB-XXVIIB of FIG. 27A in the direction of the arrows; and FIG. 27C is a cross-sectional view taken along line XXVIIC-XXVIIC of FIG. 27A in the direction of the arrows;

FIG. 29A is a plan view of a lyophilic part formed by subjecting the exposed portion of FIG. 28A to a lyophilization treatment; FIG. 29B is a cross-sectional view taken along line XXIXB-XXIXB of FIG. 29A in the direction of the arrows, and FIG. 29C is a cross-sectional view taken along line XXIXC-XXIXC of FIG. 29A in the direction of the arrows;

FIG. 31A is a plan view of a photoresist formed on the other surface of the substrate of FIG. 30A; FIG. 31B is a cross-sectional view taken along line XXXIB-XXXIB of FIG. 31A in the direction of the arrows; and FIG. 31C is a cross-sectional view taken along line XXXIC-XXXIC of FIG. 31A in the direction of the arrows;

FIG. 33A is a plan view of a resultant product obtained by removing the exposed portion of the covering membrane precursor from the photoresist of FIG. 32A; FIG. 33B is a cross-sectional view taken along line XXXIIIB-XXXIIIB of FIG. 33A in the direction of the arrows; and FIG. 33C is a cross-sectional view taken along line XXXIIIC-XXXIIIC of FIG. 33A in the direction of the arrows;

FIG. 39 is a plan view of a transmission membrane side of a second holder in the analytical cell of FIG. 36.

DESCRIPTION OF THE PREFERRED EMBODIMENTS

Various preferred embodiments of the analytical cell of the present invention will be described in detail below with reference to the accompanying drawings.

The analytical cell is suitable for use, for example, in performing an analysis of electrode reactions in a negative electrode active material and a positive electrode active material operating under electron beam transmission in various types of analytical equipment. For example, the analytical equipment may be a transmission electron microscope (TEM). In this case, the analytical cell is attached to an end of a TEM holder, and thereafter, an observation process is performed. For example, the subject of observation (i.e., the analytical cell) may be a lithium-ion secondary cell, a nickel-hydrogen cell, an alkaline-manganese cell, or the like. Examples of an analytical cell made up of a lithium-ion secondary cell will be described below.

First Embodiment

Figure 1:
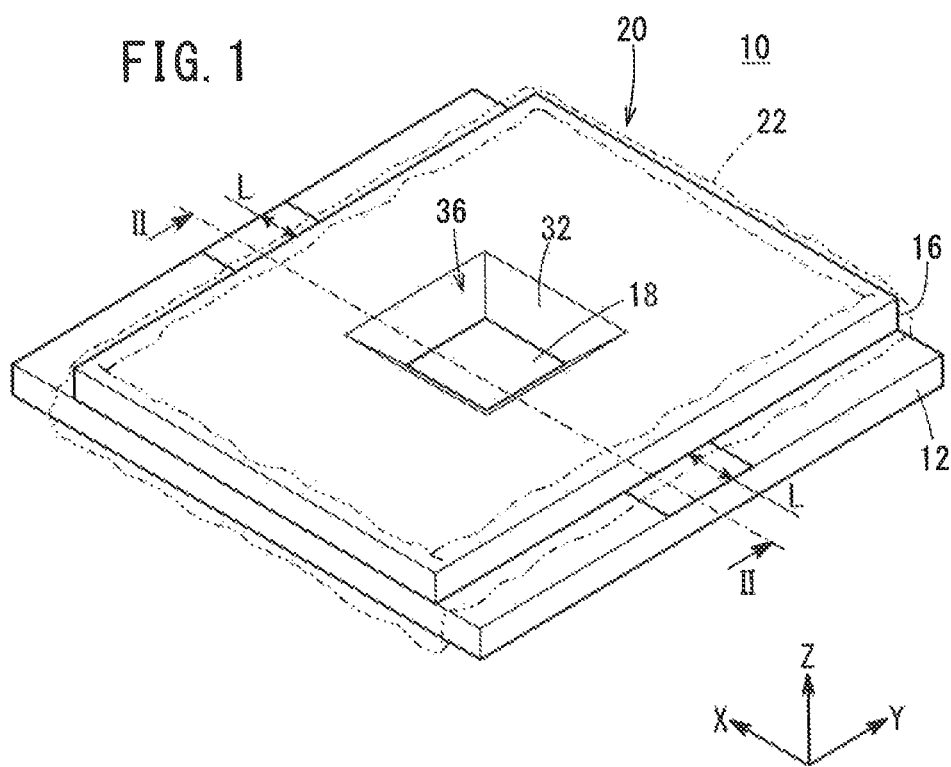
FIG. 1 is an overall schematic perspective view of an analytical cell according to a first embodiment of the present invention.
Figure 2:
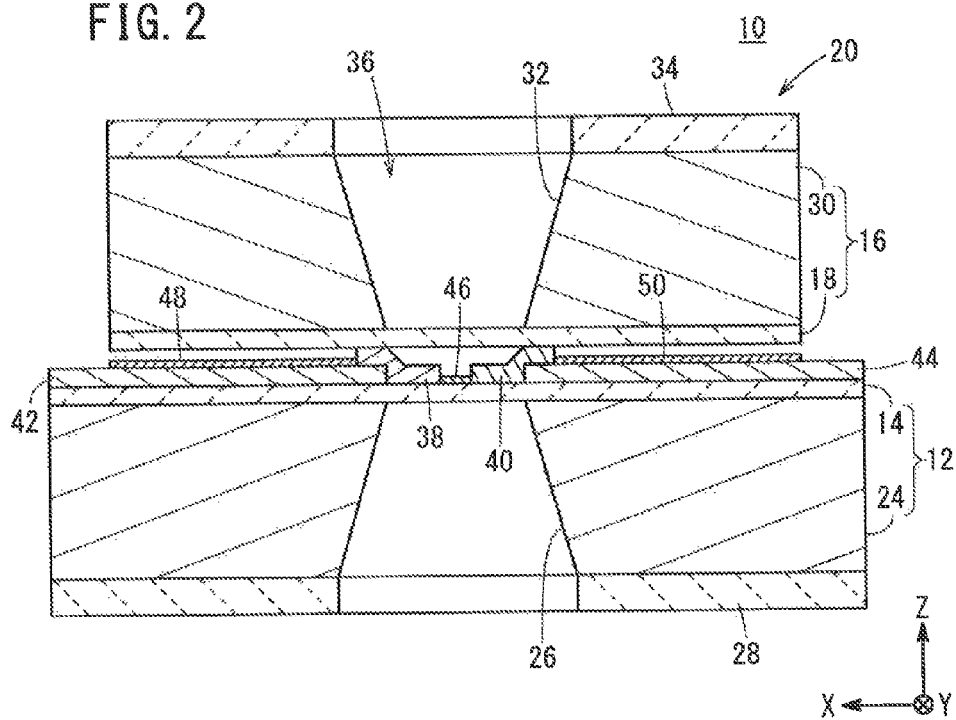
FIG. 2 is a cross-sectional view of the analytical cell taken along line II-II of FIG. 1 in the direction of the arrows.
Figure 3:
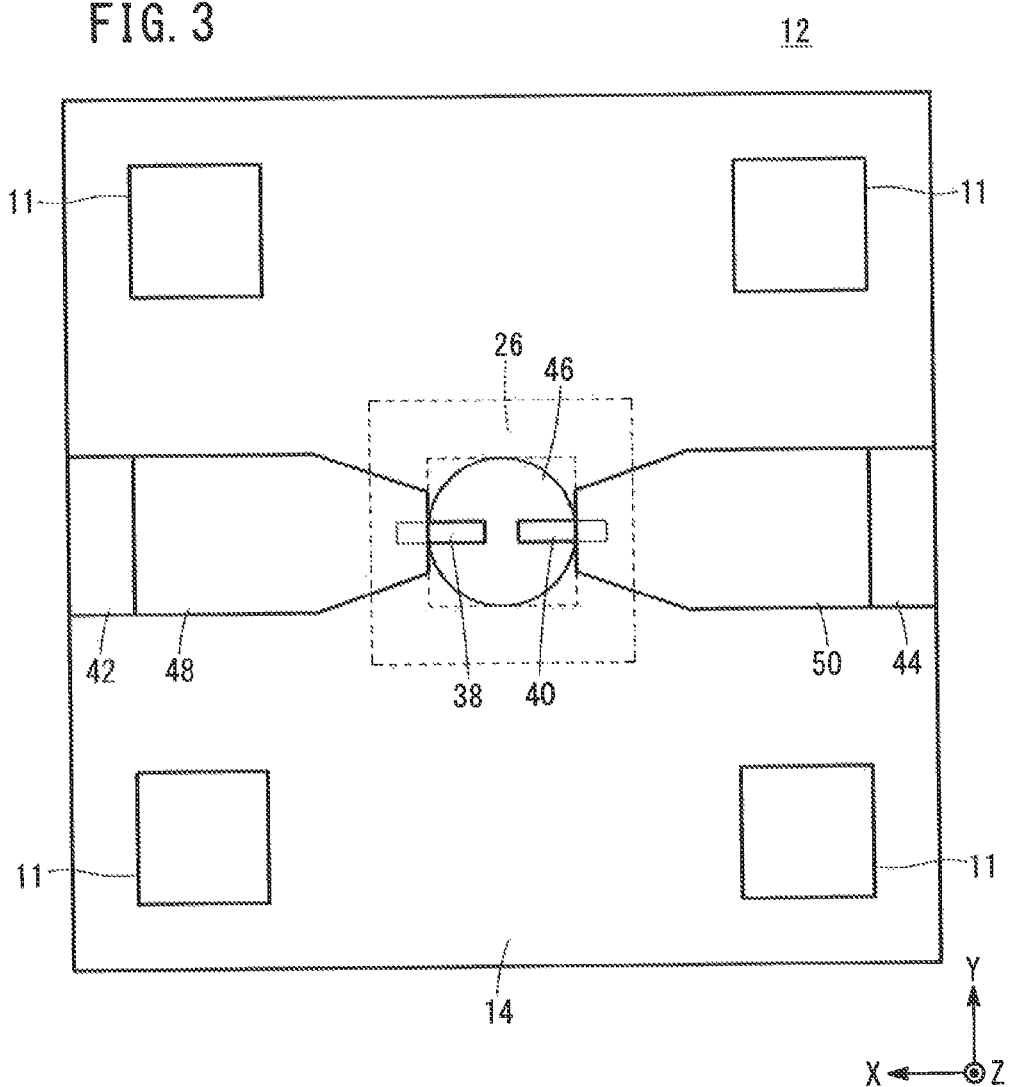
FIG. 3 is a plan view of a transmission membrane side of a first holder in the analytical cell of FIG. 1.
Figure 4:
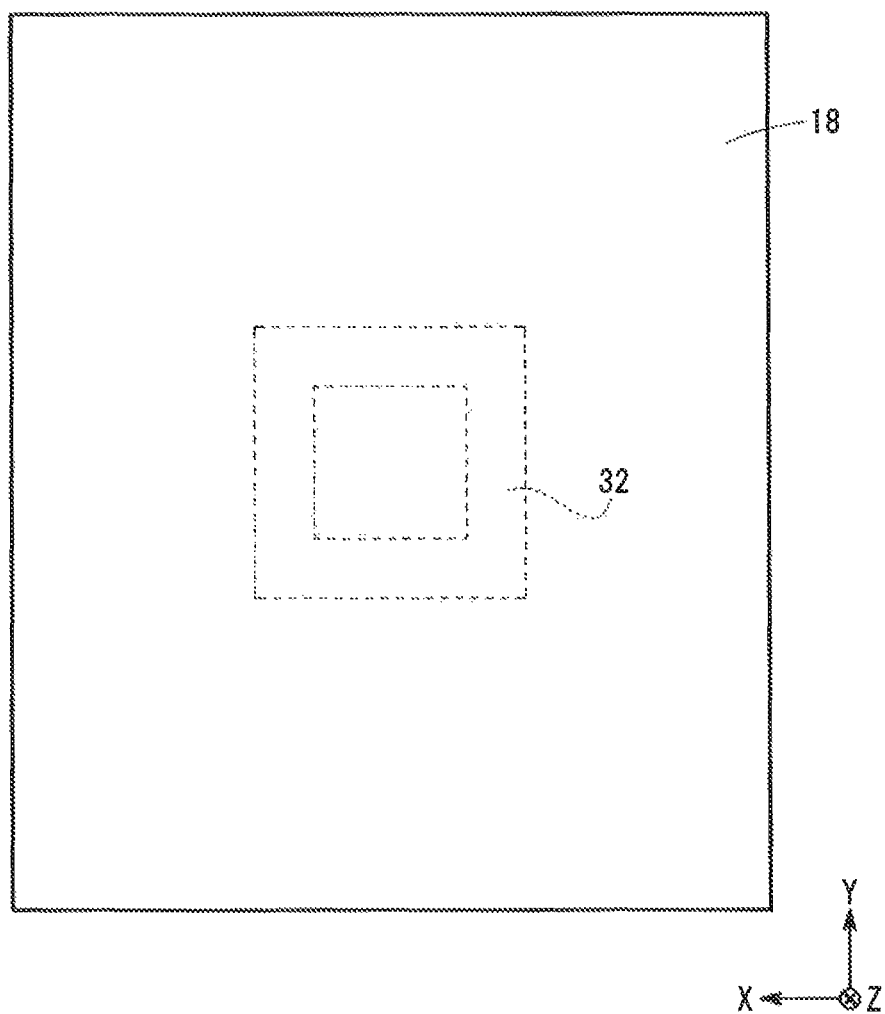
FIG. 4 is a plan view of a transmission membrane side of a second holder in the analytical cell of FIG. 1.

An analytical cell 10 according to a first embodiment will be described below with reference to FIGS. 1 to 4. FIG. 1 is an overall schematic perspective view of the analytical cell 10. FIG. 2 is a cross-sectional view taken along line II-II of FIG. 1 in the direction of the arrows. FIG. 3 is a plan view of a transmission membrane 14 side of a first holder 12 in the analytical cell 10. FIG. 4 is a plan view of a transmission membrane 18 side of a second holder 16 in the analytical cell 10. To facilitate understanding, in the following description, the X-axis, Y-axis, and Z-axis directions shown in FIGS. 1 to 4 are defined as width, depth, and height directions, respectively. In addition, in the X-axis, Y-axis, and Z-axis directions, the tip of each arrow is defined as one end, and the base end of the arrow is defined as another end.

The analytical cell 10 contains the first holder 12 and the second holder 16 stacked with an electrolytic solution interposed therebetween. More specifically, the first holder 12 and the second holder 16 are stacked to thereby form an overlapping portion 20, and spacers 11 (see FIG. 3) forming a space are interposed between the first holder 12 and the second holder 16. The overlapping portion 20 is sealed by a sealant 22 such as an epoxy-based resin adhesive (see FIG. 1), whereas the space is filled with the electrolytic solution. Incidentally, illustration of the sealant 22 is omitted in FIG. 2.

Thus, in the analytical cell 10, since the electrolytic solution is enclosed (stored) in the overlapping portion 20, it is not necessary for the electrolytic solution to be introduced additionally or to flow through the overlapping portion 20. Therefore, the pressure of the electrolytic solution acting on the first holder 12 and the second holder 16, i.e., the internal pressure of the analytical cell 10, can be lowered. Consequently, there is no need to increase the distance between the first holder 12 and the second holder 16, and the analytical cell 10 can be made smaller in size. In the present embodiment, for example, the electrolytic solution preferably is prepared by adding about 1 M of a supporting salt such as $LiPF_6$ to propylene carbonate (PC), ethylene carbonate (EC), dimethyl carbonate (DMC), diethyl carbonate (DEC), ethylmethyl carbonate (EMC), vinylene carbonate (VC), or the like.

As shown in FIGS. 2 and 3, the first holder 12 contains the transmission membrane 14 and a substrate 24. For example, the substrate 24 contains silicon (Si), silicon nitride ($Si_3N_4$), a composite of Si and an oxide layer (e.g. $SiO_2$), borosilicate glass, quartz ($SiO_2$), or the like. A through-hole 26 that penetrates in the thickness direction is formed approximately at the center of the substrate 24. The transmission membrane 14 is formed on one surface of the substrate 24 so as to cover the through-hole 26. A covering membrane 28 is formed on the other surface of the substrate 24 such that the through-hole 26 is exposed. The through-hole 26 has a truncated quadrangular pyramid shape, which is tapered in a direction from the covering membrane 28 toward the transmission membrane 14 of the substrate 24.

For example, the transmission membrane 14 contains a material having an electron beam permeability (electron beam transparency), such as silicon nitride ($Si_3N_4$), silicon carbide (SiC), or silicon (Si). The covering membrane 28 may contain the same material as the transmission membrane 14.

As shown in FIGS. 2 and 4, the second holder 16 contains a substrate 30 and the transmission membrane 18. The substrate 30 contains the same material as the substrate 24, has approximately the same depth and height as the substrate 24, and has a width that is smaller by 2L (L×2) than the width of the substrate 24. A through-hole 32 that penetrates in the thickness direction is formed approximately at the center of the substrate 30. The through-hole 32 has the same shape as the through-hole 26. The transmission membrane 18 is formed on one surface of the substrate 30 so as to cover the through-hole 32. A covering membrane 34 is formed on the other surface of the substrate 30, such that the through-hole 32 is exposed. The transmission membrane 18 and the covering membrane 34 may contain the same material as the transmission membrane 14.

The first holder 12 and the second holder 16 are stacked so as to form the overlapping portion 20, in such a manner that the through-holes 26, 32 face toward each other across the transmission membranes 14, 18. Since, as described above, the substrate 24 has a width larger by 2L than that of the substrate 30, the width direction end portions, which have a width of L in the first holder 12, are exposed and extend from the overlapping portion 20 that has been formed in this manner (see FIGS. 1 and 2).

In the overlapping portion 20, an observation window 36, through which an electron beam can be satisfactorily transmitted, is formed in the overlapping region of the through-hole 26 and the transmission membrane 14 in the first holder 12, and in the overlapping region of the through-hole 32 and the transmission membrane 18 in the second holder 16. In the analytical cell 10, a negative electrode active material 38 and a positive electrode active material 40 are arranged in the observation window 36 at a distance from each other while being in contact with the electrolytic solution between the transmission membranes 14, 18. Thus, electrode reactions and the like can be analyzed using the electron beam that is transmitted through the observation window 36. In the following description, other areas of the overlapping portion 20 apart from the observation window 36, i.e., the portion in which the substrates 24, 30 face toward each other across the transmission membranes 14, 18, will also be referred to as a facing portion.

More specifically, as shown in FIGS. 2 and 3, both of the negative electrode active material 38 and the positive electrode active material 40 are formed on the transmission membrane 14 in the first holder 12. A negative electrode collector 42, a positive electrode collector 44, a lyophilic part 46, and the spacers 11 are further formed on the transmission membrane 14. The negative electrode collector 42 and the positive electrode collector 44 are connected electrically to the negative electrode active material 38 and the positive electrode active material 40, respectively.

For example, the spacers 11 contain an electrically insulating material, have a cuboid shape, and are positioned around the four corners of the overlapping portion 20. The arrangement and shape of the spacers 11 are not particularly limited, so long as a desired space can be formed easily in the overlapping portion 20 by the spacers 11. The spacers 11 are not necessary in the case that the desired space can be formed in the overlapping portion 20 without the spacers 11.

The negative electrode active material 38 has a layer structure, which extends from the observation window 36 toward one end side in the width direction in the facing portion. The negative electrode active material 38 preferably is prepared from a substance such as Li or a Li alloy, $Li_4Ti_5O_{12}$, Si, Ge, Sn, a Sn alloy, Al or an Al alloy, a Si oxide, a Sn oxide, an Al oxide, or carbon (C).

The positive electrode active material 40 has a layer structure, which extends from the observation window 36 toward the other end side in the width direction in the facing portion. The positive electrode active material 40 preferably is prepared from a substance such as $LiCoO_2$, $LiMnO_2$, $LiMn_2O_4$, $LiNiO_2$, $LiFePO_4$, $Li_2FePO_4F$, $LiCo_{1/3}Ni_{1/3}Mn_{1/3}O_2$, or $Li(Li_\alpha Ni_x Mn_y Co_z)O_2$.

The other end of the negative electrode collector 42 in the width direction is connected electrically to the negative electrode active material 38 in the facing portion in the overlapping portion 20, and the one end in the width direction is exposed to the outside of the overlapping portion 20. In the example of FIGS. 1 to 4, the exposed portion of the first holder 12, which protrudes or extends from the overlapping portion 20, has a width L. Thus, the exposed portion in the one end of the negative electrode collector 42, which protrudes or extends from the overlapping portion 20, also has a width L. One surface of the negative electrode collector 42 is in contact with the transmission membrane 14. On the other surface of the negative electrode collector 42, a lyophobic part 48 is formed in a portion that is in contact with the electrolytic solution inside of the overlapping portion 20. The negative electrode collector 42 preferably contains a substance such as tungsten (W), copper (Cu), aluminum (Al), stainless steel (SUS), platinum (Pt), gold (Au), or carbon (C).

The lyophobic part 48 can be formed by subjecting the surface of the negative electrode collector 42 to a lyophobization treatment. The lyophobic part 48 has no affinity for (or repels, is lyophobic to) the electrolytic solution. Therefore, the electrolytic solution exhibits a larger contact angle (smaller contact area) on the lyophobic part 48 than on the surface of the negative electrode collector 42 without the lyophobic part 48. Thus, the electrolytic solution hardly comes into contact with the lyophobic part 48 on the negative electrode collector 42 in the overlapping portion 20.

The lyophobization treatment is not particularly limited, and may be selected from known treatments that are capable of forming the lyophobic part 48 so as to be lyophobic to the electrolytic solution on the surface of the negative electrode collector 42. For example, preferably, in the lyophobization treatment, a coating of a silane coupling agent such as dihexyldiethoxysilane $(C_6H_{12})_2Si(OC_2H_5)_2$ is formed on the surface of the negative electrode collector 42.

The positive electrode collector 44 has the same structure as the negative electrode collector 42, except that one end in the width direction is electrically connected to the positive electrode active material 40 in the facing portion in the overlapping portion 20. Thus, the other end of the positive electrode collector 44 in the width direction is exposed and extends from the overlapping portion 20 by the width L. One surface of the positive electrode collector 44 is in contact with the transmission membrane 14. On the other surface of the positive electrode collector 44, a lyophobic part 50 is formed in a portion that is in contact with the electrolytic solution inside of the overlapping portion 20. The lyophobic part 50 has the same structure as the above-described lyophobic part 48. In the negative electrode collector 42 and the positive electrode collector 44, portions that protrude from the overlapping portion 20 will hereinafter be referred to also as exposed portions.

The lyophilic part 46 can be formed by a lyophilization treatment in the vicinity of the negative electrode active material 38 and the positive electrode active material 40 on the surface of the transmission membrane 14 that is in contact with the electrolytic solution. The lyophilic part 46 has an affinity for (or is attracted to, lyophilic to) the electrolytic solution. Therefore, the electrolytic solution exhibits a smaller contact angle (larger contact area) on the lyophilic part 46 than on the surface of the transmission membrane 14 without the lyophilic part 46. Thus, with the lyophilic part 46 in the overlapping portion 20, the electrolytic solution can more easily be located in the vicinity of the negative electrode active material 38 and the positive electrode active material 40. The vicinity of the negative electrode active material 38 and the positive electrode active material 40 is a region in which the lyophilic part 46, which is formed on the transmission membrane 14, can act more efficiently to supply the electrolytic solution to the negative electrode active material 38 and the positive electrode active material 40.

The lyophilization treatment is not particularly limited, and may be selected from known treatments that are capable of forming the lyophilic part 46 so as to be lyophobic to the electrolytic solution on the transmission membrane 14. For example, the lyophilization treatment preferably is a plasma treatment such as an ion bombardment treatment. In an ion bombardment treatment, for example, argon (Ar) ions or oxygen ($O_2$) ions are generated by plasma discharge and are emitted onto the transmission membrane 14. During the plasma treatment, the surface of the transmission membrane 14 is modified in order to form the lyophilic part 46. In this case, the lyophilic part 46 is not a coating having a layer structure. However, for purposes of illustration, the lyophilic part 46 is shown to have a layer structure in the drawings.

In the analytical cell 10 having the above structure, the negative electrode active material 38 and the positive electrode active material 40 can be connected electrically to the external of the overlapping portion 20 (e.g., to an external circuit) by the negative electrode collector 42 and the positive electrode collector 44. Thus, for example, during the step of forming the sealant 22, when metal wires for electrical connection (not shown) are interposed between the exposed portions and the sealant 22, the metal wires are electrically connected, respectively, to the negative electrode collector 42 and the positive electrode collector 44.

For example, the metal wires are connected to an external circuit such as a charge-discharge tester. In this case, the negative electrode active material 38 and the positive electrode active material 40 can be connected electrically to the external circuit by the negative electrode collector 42 and the positive electrode collector 44. Consequently, desired electrode reactions such as charge-discharge reactions can be carried out in the cell that contains the negative electrode active material 38, the positive electrode active material 40, and the electrolytic solution.

For example, during TEM observation of the analytical cell 10, the analytical cell 10 is placed on the TEM holder in a manner such that the observation window 36 faces toward an electron beam irradiating part of the TEM. Then, the metal wires are connected to the charge-discharge tester or the like and a potential difference is applied between the metal wires in order to cause the electrode reactions, which serve as the subject of observation, in the negative electrode active material 38 and the positive electrode active material 40.

During this process, in the overlapping portion 20, the negative electrode active material 38 and the positive electrode active material 40 can easily be brought into contact with the electrolytic solution due to the lyophilic part 46, while the negative electrode collector 42 and the positive electrode collector 44 cannot easily be brought into contact with the electrolytic solution due to the lyophobic parts 48, 50. Therefore, side reactions, which differ from the electrode reactions as the observation subjects, can be suppressed on the negative electrode collector 42 and the positive electrode collector 44. Consequently, electrode reactions of the negative electrode active material 38 and the positive electrode active material 40 can be analyzed accurately while the electron beam is transmitted through the observation window 36.

For example, in a specific method using the TEM for analyzing the electrode reactions, an electron diffraction pattern is obtained based on the electron beam transmitted through the observation window 36. When the negative electrode active material 38 or the positive electrode active material 40 undergoes a physical or chemical change during the process of the electrode reaction, the change is shown in the electron diffraction pattern. Therefore, information concerning changes in the negative electrode active material 38 and the positive electrode active material 40 can be obtained by observing the electron diffraction pattern during the electrode reactions. In the present embodiment, deterioration of information accuracy due to the above-described side reactions can be prevented. Thus, so-called in-situ observations can be performed highly accurately.

The analytical cell 10 may be produced by a known semiconductor process (see, e.g., International Publication No. WO 2008/141147). A method for producing the analytical cell 10 will be described below with reference to FIGS. 5A to 35C. However, it should be understood that production of the analytical cell 10 and the process sequence in the production method are not limited to the example described below.

The analytical cell 10 may be produced by preparing the first holder 12 and the second holder 16 separately, and then combining the first holder 12 and the second holder 16 together. First, a method for preparing the first holder 12 will be described below. In the following example, the substrate 24 and the negative electrode active material 38 are made of silicon (Si), the transmission membrane 14 and the covering membrane 28 are made of silicon nitride ($Si_3N_4$), the negative electrode collector 42 and the positive electrode collector 44 are made of tungsten (W), and the positive electrode active material 40 is made of lithium cobaltate ($LiCoO_2$).

First, as shown in FIGS. 5A to 5C, both surfaces of the substrate 24 are polished, and each of the surfaces is covered with a silicon nitride membrane by chemical vapor deposition (CVD). The silicon nitride membrane, which is formed on the one surface of the substrate 24, is used as a precursor for the transmission membrane 14 (transmission membrane precursor 52), and the silicon nitride membrane, which is formed on the other surface, is used as a precursor for the covering membrane 28 (covering membrane precursor 54).

Figure 6A:
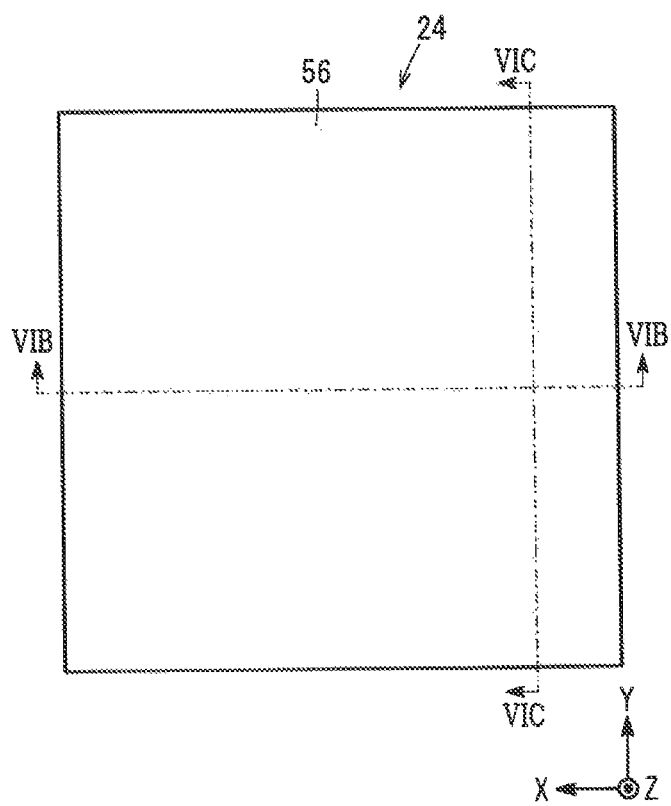
FIG. 6A is a plan view of a photoresist formed on the one surface of the substrate of FIG. 5A.
Figure 6C:
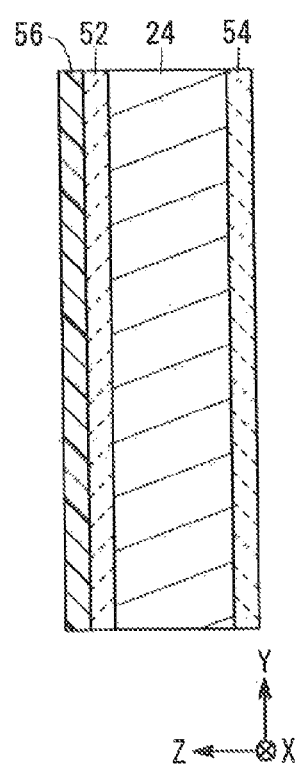
FIG. 6C is a cross-sectional view taken along line VIC-VIC of FIG. 6A in the direction of the arrows.
Figure 6B:
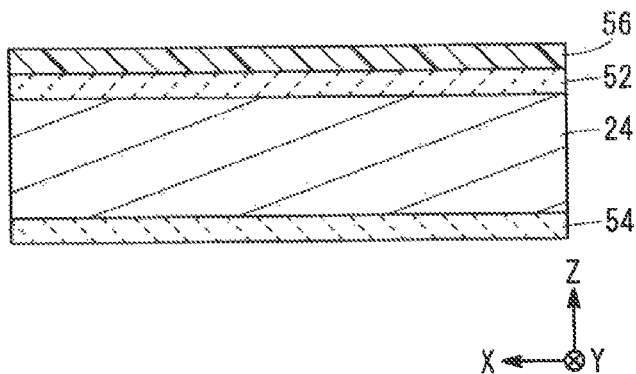
FIG. 6B is a cross-sectional view taken along line VIB-VIB of FIG. 6A in the direction of the arrows.
Figure 7A:
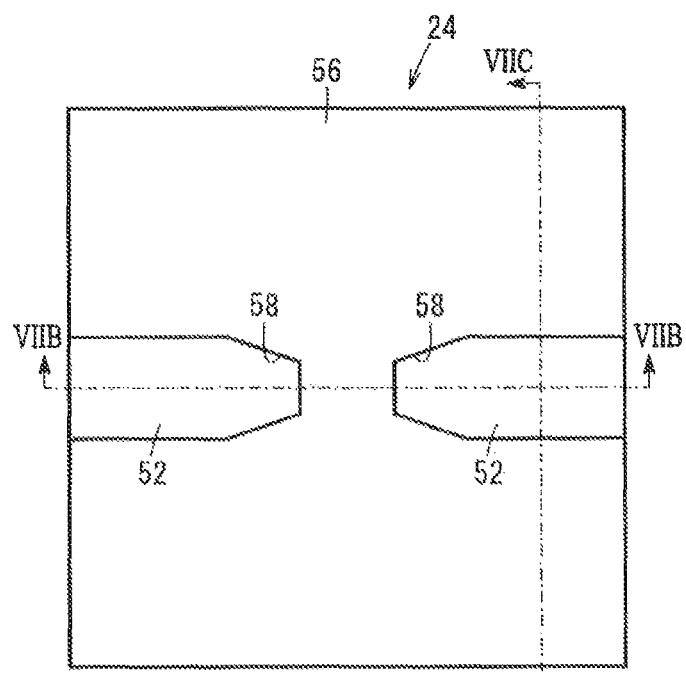
FIG. 7A is a plan view of collector-shaped portions formed by patterning the photoresist of FIG. 6A, so that the transmission membrane precursor is exposed in the portions.
Figure 7C:
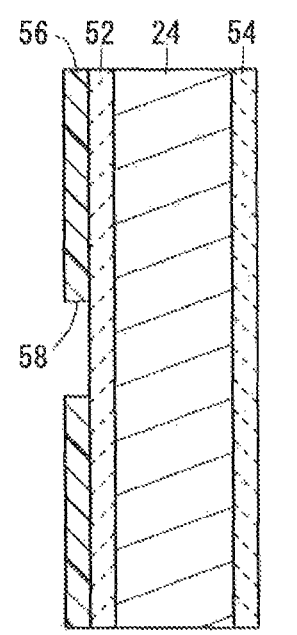
FIG. 7C is a cross-sectional view taken along line VIIC-VIIC of FIG. 7A in the direction of the arrows.
Figure 7B:
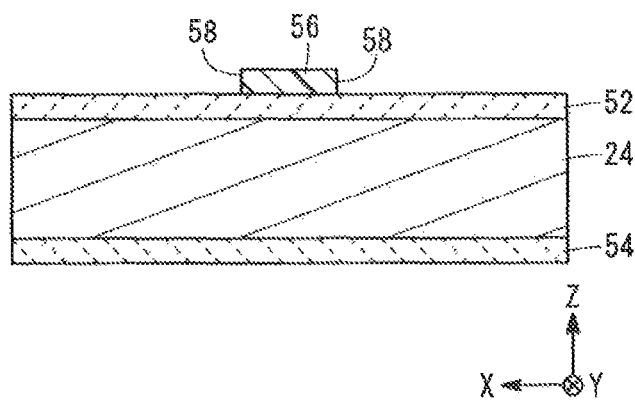
FIG. 7B is a cross-sectional view taken along line VIIB-VIIB of FIG. 7A in the direction of the arrows.

As shown in FIGS. 6A to 6C, the transmission membrane precursor 52 is covered with a photoresist 56. As shown in FIGS. 7A to 7C, the photoresist 56 is removed by a photolithography process in portions corresponding to the negative electrode collector 42 and the positive electrode collector 44. Thus, two (a pair of) collector-shaped portions 58, 58, which have the same shapes as the negative electrode collector 42 and the positive electrode collector 44, are formed by removing the photoresist 56, and the transmission membrane precursor 52 is exposed in the collector-shaped portions 58, 58.

Then, as shown in FIGS. 8A to 8C, a reactive ion etching process is carried out using the photoresist 56 as a mask, whereby the height of the exposed portions of the transmission membrane precursor 52 is reduced in the collector-shaped portions 58, 58. Thus, within the transmission membrane precursor 52, the portions corresponding to the negative electrode collector 42 and the positive electrode collector 44 are thinned by the reduced height of the negative electrode collector 42 and the positive electrode collector 44.

Figure 9A:
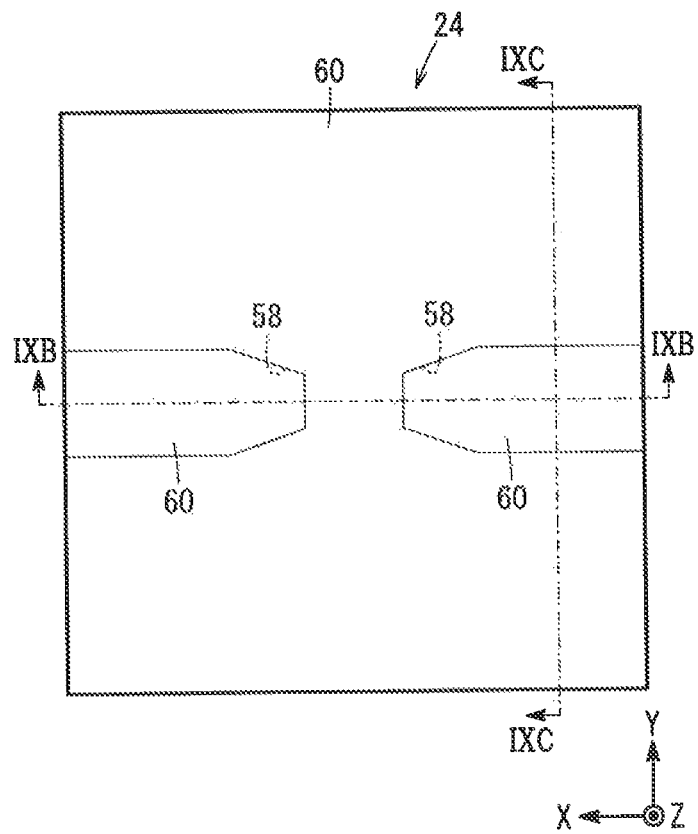
FIG. 9A is a plan view of a collector precursor formed on the one surface of the substrate of FIG. 8A.
Figure 9C:
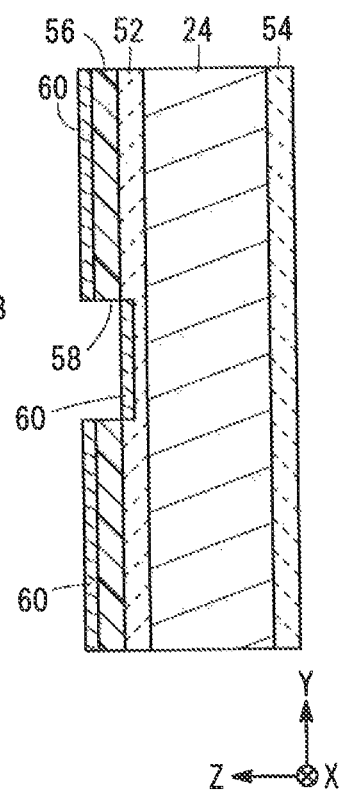
FIG. 9C is a cross-sectional view taken along line IXC-IXC of FIG. 9A in the direction of the arrows.
Figure 9B:
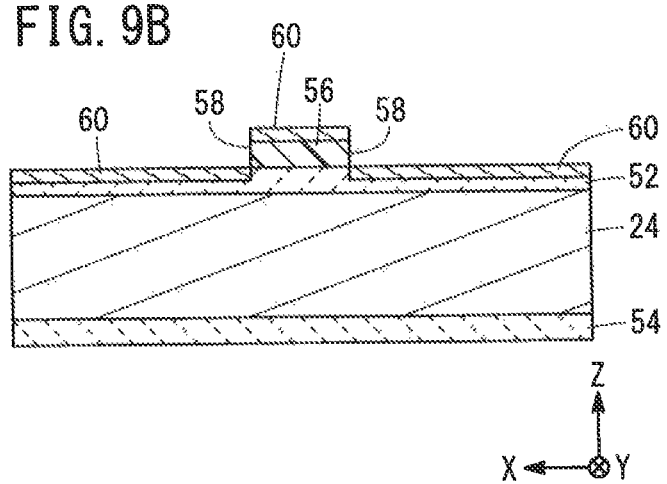
FIG. 9B is a cross-sectional view taken along line IXB-IXB of FIG. 9A in the direction of the arrows.
Figure 10A:
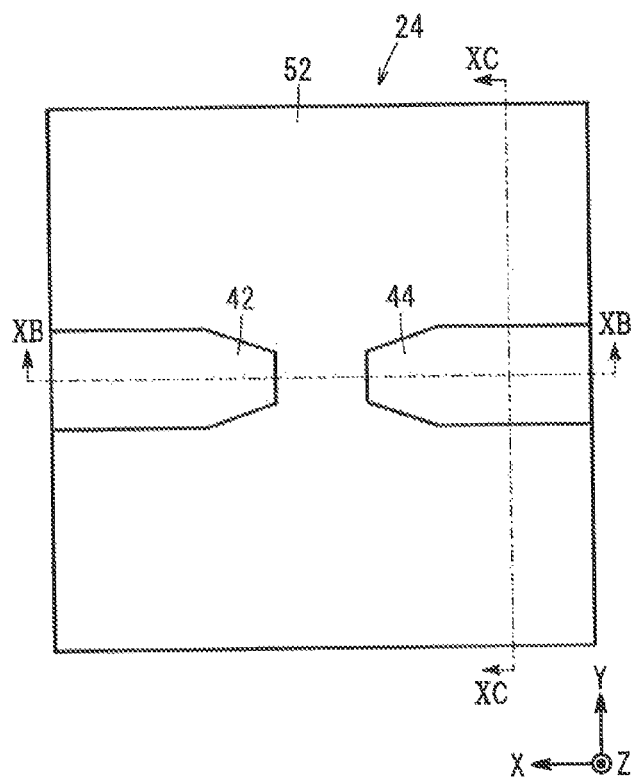
FIG. 10A is a plan view of a negative electrode collector and a positive electrode collector obtained by removing the photoresist of FIG. 9A.
Figure 10C:
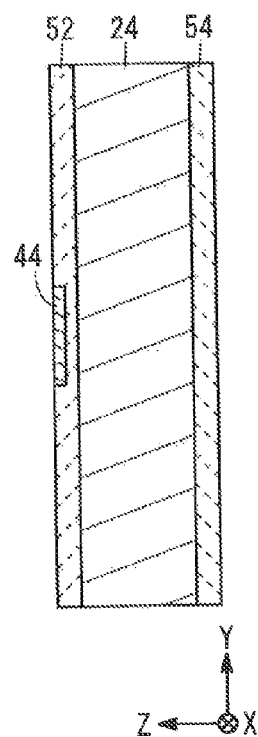
FIG. 10C is a cross-sectional view taken along line XC-XC of FIG. 10A in the direction of the arrows.
Figure 10B:
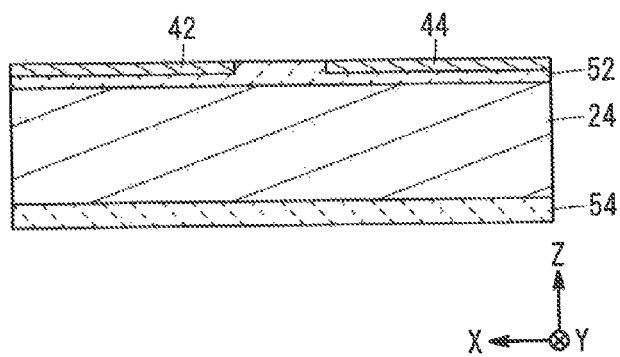
FIG. 10B is a cross-sectional view taken along line XB-XB of FIG. 10A in the direction of the arrows.

As shown in FIGS. 9A to 9C, the exposed portions of the transmission membrane precursor 52 and the photoresist 56 are covered with a tungsten membrane by a physical vapor deposition (PVD) method such as vacuum deposition. The tungsten membrane is used as a precursor for the negative electrode collector 42 and the positive electrode collector 44 (collector precursor 60). Then, as shown in FIGS. 10A to 10C, the entire photoresist 56 is removed (lifted off), whereby the negative electrode collector 42 and the positive electrode collector 44 are formed in the thinned portions of the transmission membrane precursor 52.

Figure 11A:
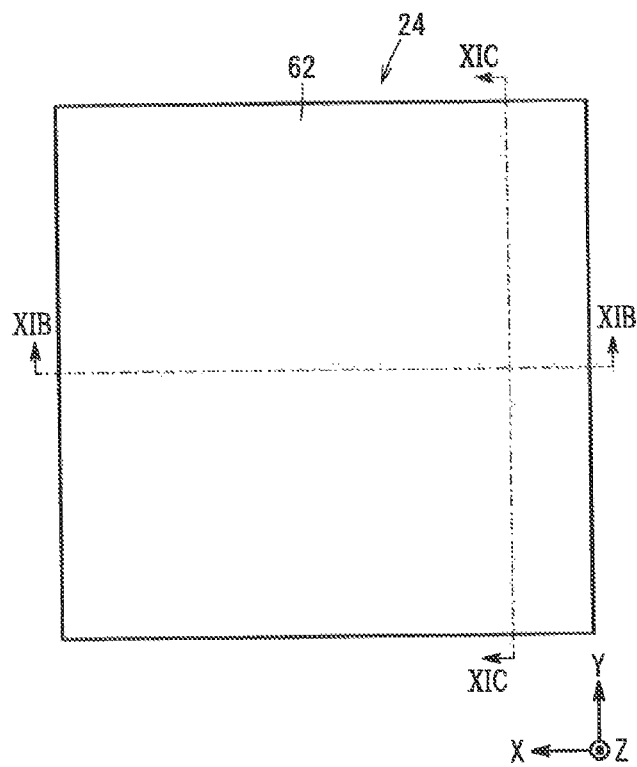
FIG. 11A is a plan view of a photoresist formed on the one surface of the substrate of FIG. 10A.
Figure 11C:
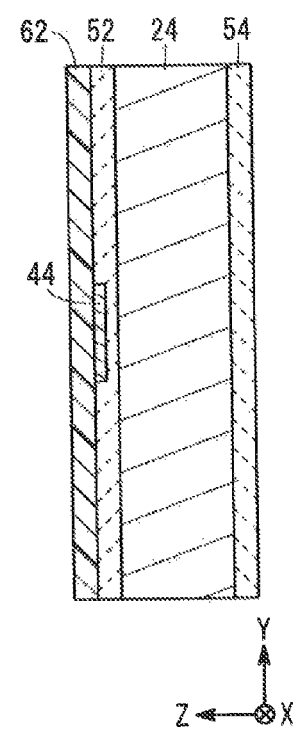
FIG. 11C is a cross-sectional view taken along line XIC-XIC of FIG. 11A in the direction of the arrows.
Figure 11B:
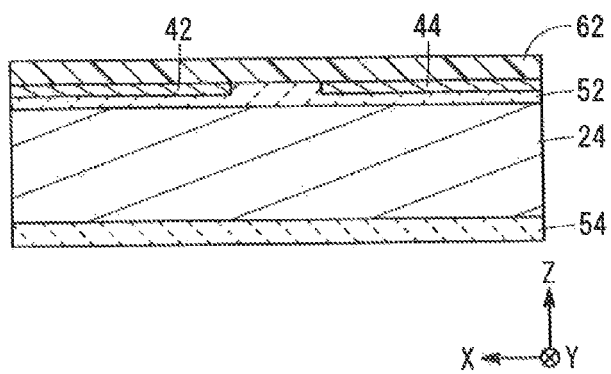
FIG. 11B is a cross-sectional view taken along line XIB-XIB of FIG. 11A in the direction of the arrows.

As shown in FIGS. 11A to 11C, the one surface of the substrate 24, which includes the transmission membrane precursor 52, the negative electrode collector 42, and the positive electrode collector 44, is covered with a photoresist 62. As shown in FIGS. 12A to 12C, the photoresist 62 is patterned by a photolithography process, such that the photoresist 62 remains only on the negative electrode collector 42, the positive electrode collector 44, and portions corresponding to the spacers 11. Thus, spacer formation membranes 64 of the photoresist 62, which become the spacers 11, are formed in the formation portions.

As shown in FIGS. 13A to 13C, a reactive ion etching process is carried out using the photoresist 62 as a mask. During this process, the negative electrode collector 42 and the positive electrode collector 44 are protected by residues of the photoresist 62, and the height of the exposed portion of the transmission membrane precursor 52 is reduced around the spacer formation membranes 64. Thus, within the transmission membrane precursor 52, portions that are covered with the spacer formation membranes 64 protrude as first spacer-shaped portions 66. The first spacer-shaped portions 66 have approximately the same height as the negative electrode collector 42 and the positive electrode collector 44.

Figure 14A:
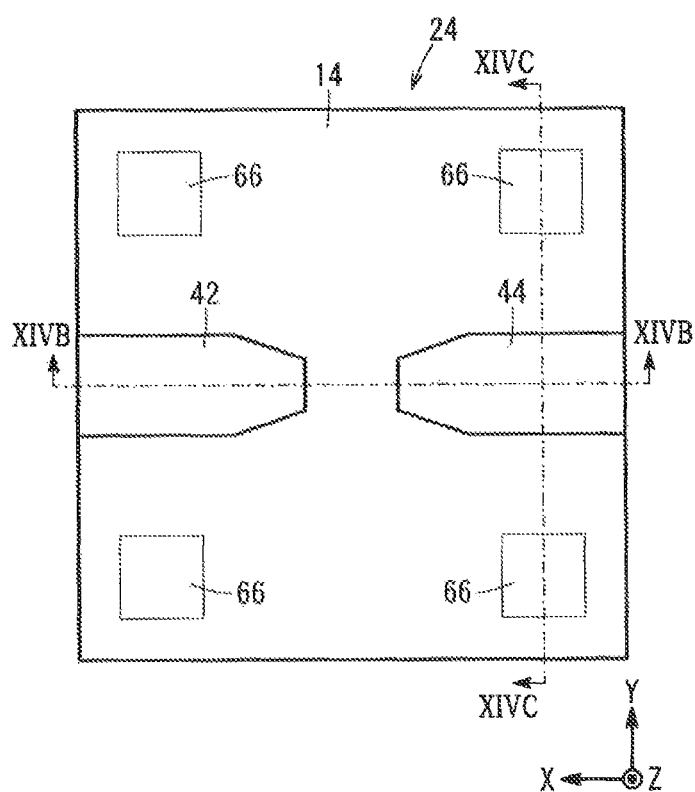
FIG. 14A is a plan view of first spacer-shaped portions of the transmission membrane precursor obtained by removing the patterned photoresist of FIG. 13A.
Figure 14C:
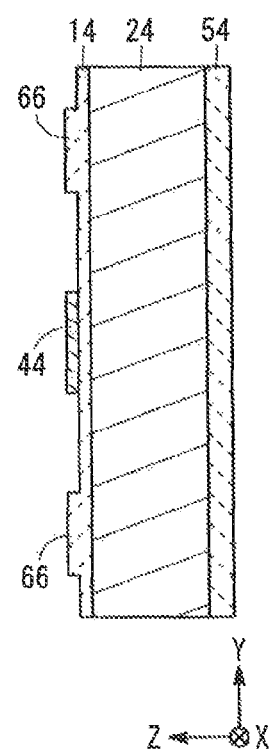
FIG. 14C is a cross-sectional view taken along line XIVC-XIVC of FIG. 14A in the direction of the arrows.
Figure 14B:
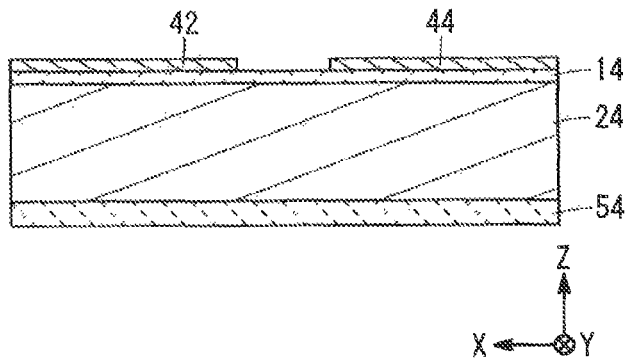
FIG. 14B is a cross-sectional view taken along line XIVB-XIVB of FIG. 14A in the direction of the arrows.
Figure 15A:
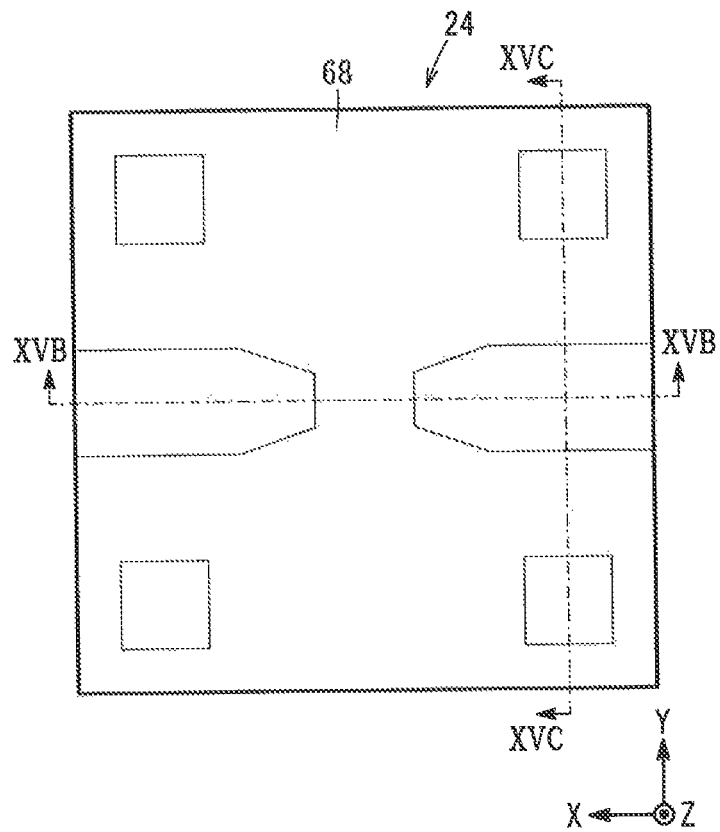
FIG. 15A is a plan view of a photoresist formed on the one surface of the substrate of FIG. 14A.
Figure 15C:
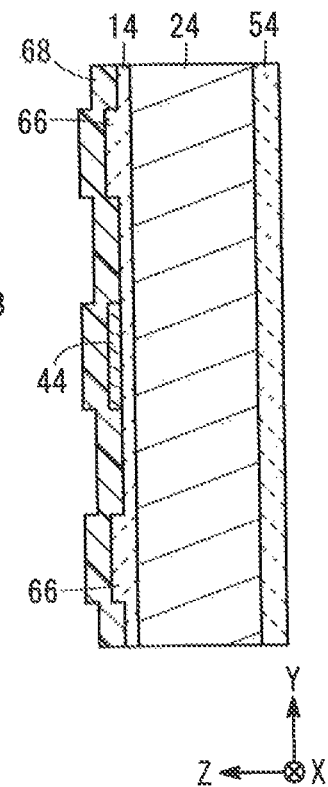
FIG. 15C is a cross-sectional view taken along line XVC-XVC of FIG. 15A in the direction of the arrows.
Figure 15B:
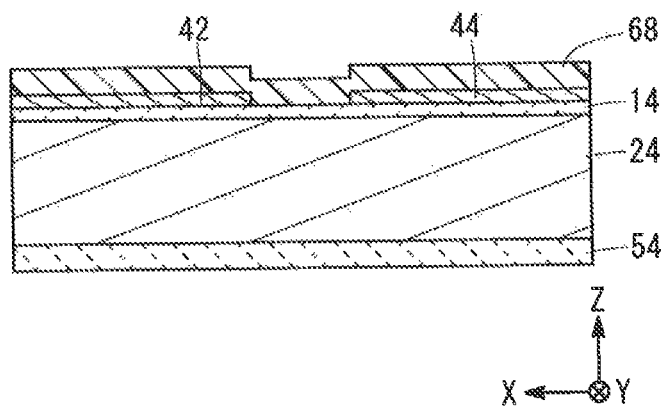
FIG. 15B is a cross-sectional view taken along line XVB-XVB of FIG. 15A in the direction of the arrows.

As shown in FIGS. 14A to 14C, the photoresist 62 is lifted off in order to obtain the transmission membrane 14. Then, as shown in FIGS. 15A to 15C, the one surface of the substrate 24, which includes the transmission membrane 14, the first spacer-shaped portions 66, the negative electrode collector 42, and the positive electrode collector 44, is covered with a photoresist 68.

As shown in FIGS. 16A to 16C, the photoresist 68 is patterned by a photolithography process, such that a portion corresponding to the negative electrode active material 38 on the transmission membrane 14 and the negative electrode collector 42 is exposed, and the first spacer-shaped portions 66 are further exposed. Thus, a negative electrode active material formation portion 70 is formed by removing the photoresist 68 along the shape of the negative electrode active material 38.

Figure 17A:
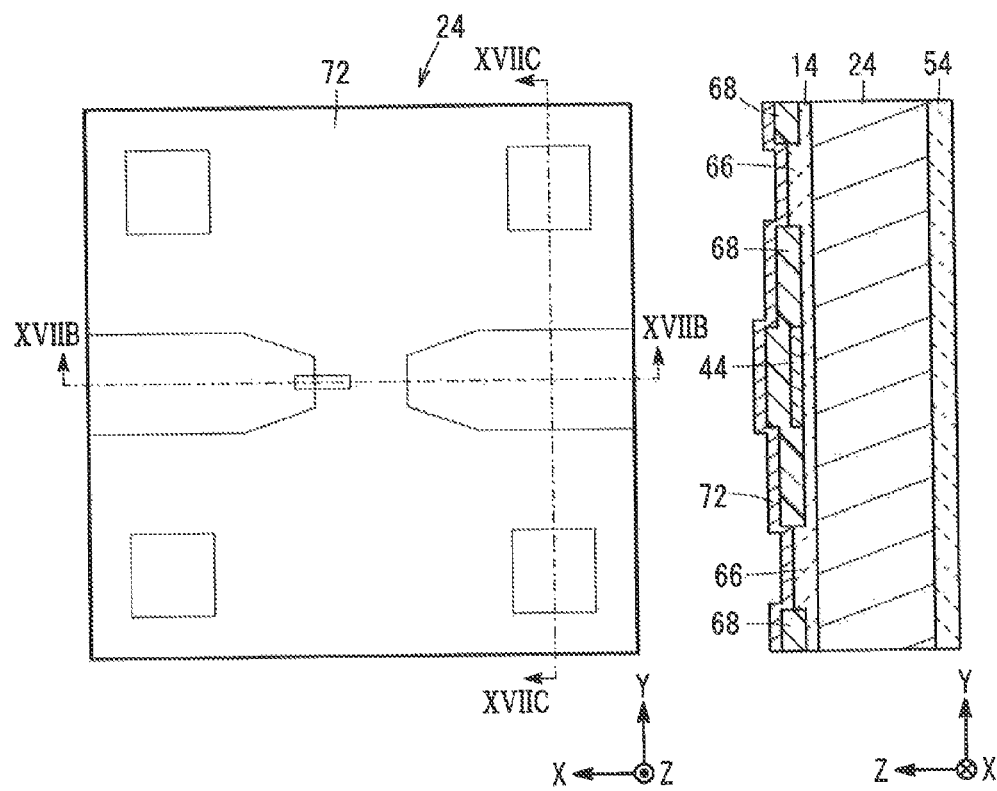
FIG. 17A is a plan view of a negative electrode active material precursor formed on the one surface of the substrate of FIG. 16A.
Figure 17C:
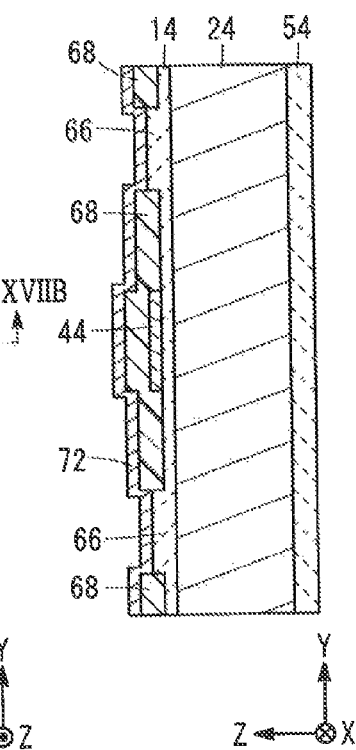
FIG. 17C is a cross-sectional view taken along line XVIIC-XVIIC of FIG. 17A in the direction of the arrows.
Figure 17B:
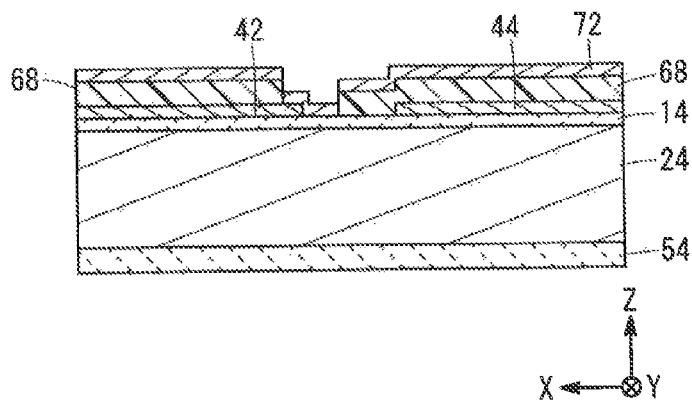
FIG. 17B is a cross-sectional view taken along line XVIIB-XVIIB of FIG. 17A in the direction of the arrows.

As shown in FIGS. 17A to 17C, the one surface of the substrate 24, which includes the photoresist 68, the first spacer-shaped portions 66, and the negative electrode active material formation portion 70, is covered with a silicon membrane by a physical vapor deposition (PVD) method such as vacuum deposition. The silicon membrane is used as a precursor for the negative electrode active material 38 (negative electrode active material precursor 72). As shown in FIGS. 18A to 18C, the photoresist 68 is lifted off in order to obtain the negative electrode active material 38. Furthermore, second spacer-shaped portions 74 are obtained from the negative electrode active material precursor 72 that remains on the first spacer-shaped portions 66. Thus, the first spacer-shaped portions 66 and the second spacer-shaped portions 74 are stacked in order to form the spacers 11.

Figure 19A:
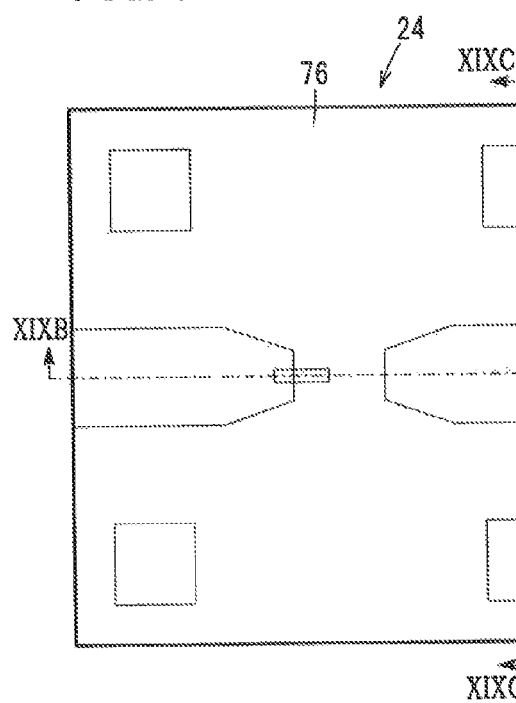
FIG. 19A is a plan view of a photoresist formed on the one surface of the substrate of FIG. 18A.
Figure 19C:
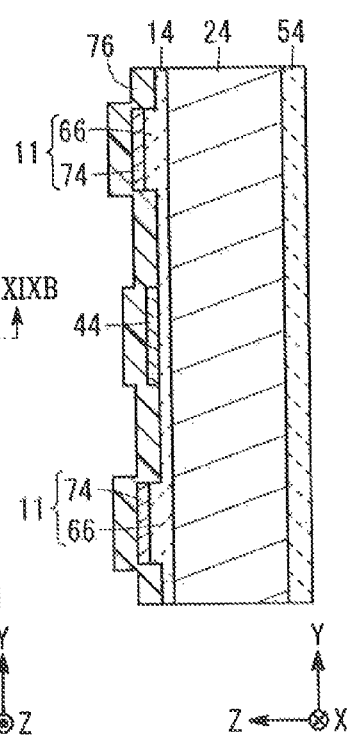
FIG. 19C is a cross-sectional view taken along line XIXC-XIXC of FIG. 19A in the direction of the arrows.
Figure 19B:
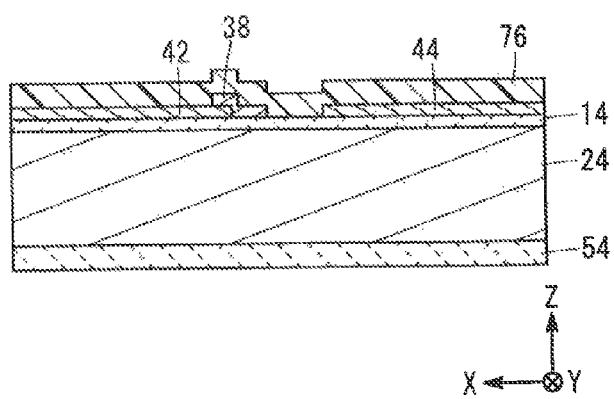
FIG. 19B is a cross-sectional view taken along line XIXB-XIXB of FIG. 19A in the direction of the arrows.
Figure 20A:
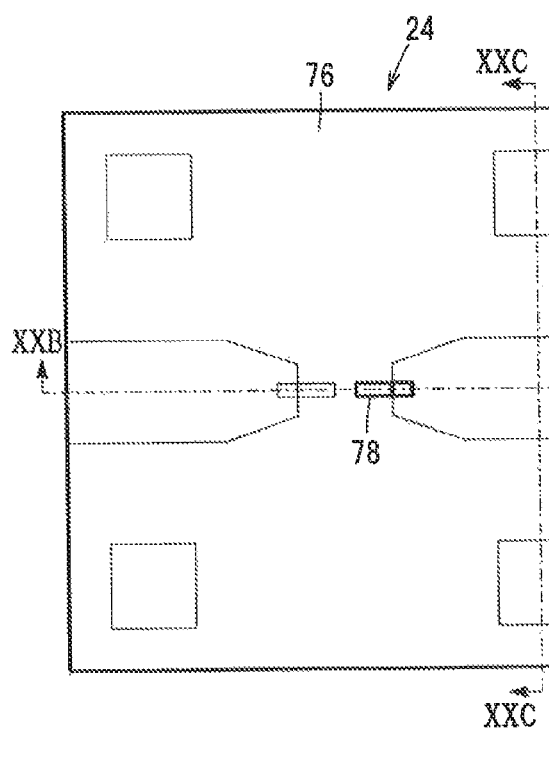
FIG. 20A is a plan view of a positive electrode active material formation portion (formed on the transmission membrane and the positive electrode collector) exposed by patterning the photoresist of FIG. 19A.
Figure 20C:
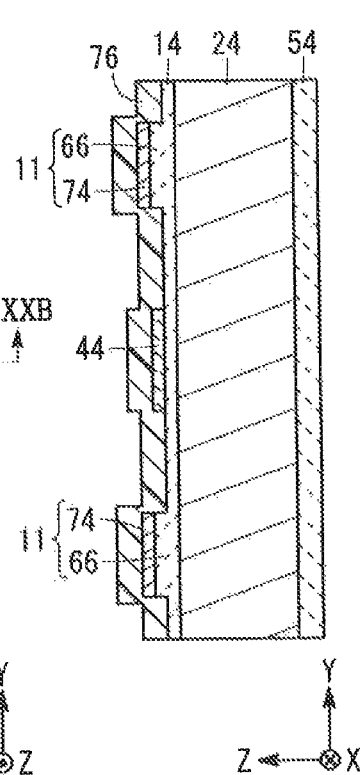
FIG. 20C is a cross-sectional view taken along line XXC-XXC of FIG. 20A in the direction of the arrows.
Figure 20B:
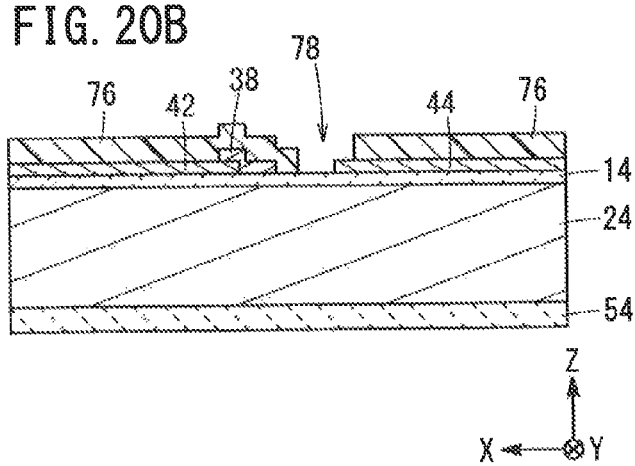
FIG. 20B is a cross-sectional view taken along line XXB-XXB of FIG. 20A in the direction of the arrows.

As shown in FIGS. 19A to 19C, the one surface of the substrate 24, which includes the negative electrode active material 38, the negative electrode collector 42, the positive electrode collector 44, the transmission membrane 14, and the spacers 11, is covered with a photoresist 76. As shown in FIGS. 20A to 20C, the photoresist 76 is patterned by a photolithography process such that a portion thereof, which corresponds to the positive electrode active material 40 on the transmission membrane 14 and the positive electrode collector 44, is exposed. Thus, a positive electrode active material formation portion 78 is formed by removing the photoresist 76 along the shape of the positive electrode active material 40.

Figure 22A:
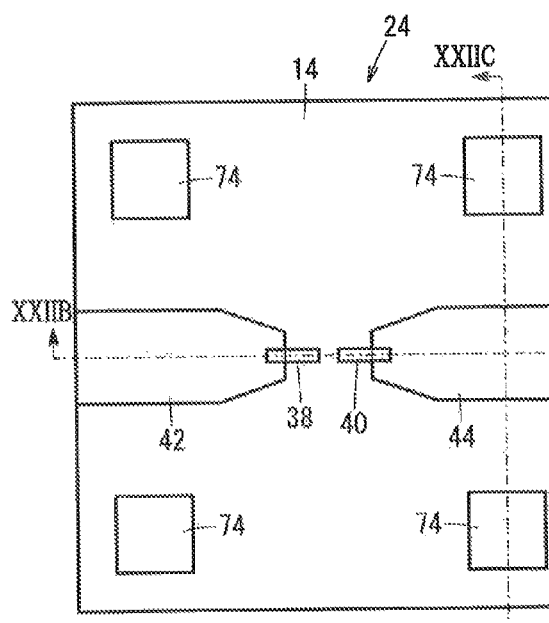
FIG. 22A is a plan view of a positive electrode active material obtained by removing the photoresist of FIG. 21A.
Figure 22C:
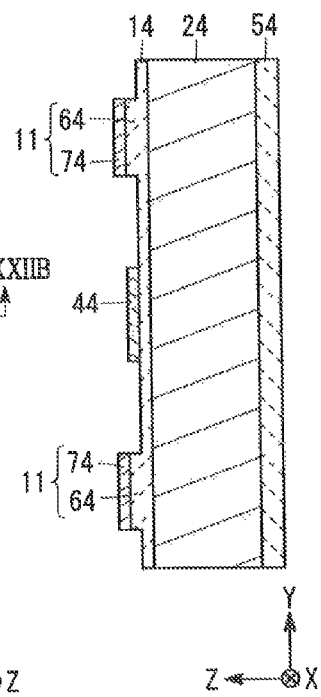
FIG. 22C is a cross-sectional view taken along line XXIIC-XXIIC of FIG. 22A in the direction of the arrows.
Figure 22B:
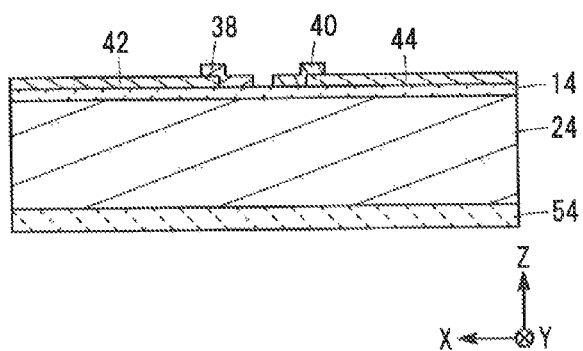
FIG. 22B is a cross-sectional view taken along line XXIIB-XXIIB of FIG. 22A in the direction of the arrows.

As shown in FIGS. 21A to 21C, the one surface of the substrate 24, which includes the photoresist 76 and the positive electrode active material formation portion 78, is covered with a lithium cobaltate membrane by a physical vapor deposition (PVD) method such as vacuum deposition. The lithium cobaltate membrane is used as a precursor for the positive electrode active material 40 (positive electrode active material precursor 80). As shown in FIGS. 22A to 22C, the photoresist 76 is lifted off in order to obtain the positive electrode active material 40.

As shown in FIGS. 23A to 23C, the one surface of the substrate 24, which includes the negative electrode active material 38, the positive electrode active material 40, the negative electrode collector 42, the positive electrode collector 44, the transmission membrane 14, and the spacers 11, is covered with a photoresist 82.

As shown in FIGS. 24A to 24C, the photoresist 82 is patterned by a photolithography process, such that portions corresponding to the lyophobic parts 48, 50 are exposed. During this process, the photoresist 82 remains in the exposed portions on the negative electrode collector 42 and the positive electrode collector 44, i.e., in the width-direction end portions having the width L of the substrate 24. Furthermore, the photoresist 82 also remains in portions that correspond to the negative electrode active material 38 and the positive electrode active material 40 on the negative electrode collector 42 and the positive electrode collector 44.

As shown in FIGS. 25A to 25C, the exposed surfaces of the negative electrode collector 42 and the positive electrode collector 44 in the photoresist 82 are subjected to a lyophobization treatment, thereby forming the lyophobic parts 48, 50. In the case that a silane coupling agent is used in the lyophobization treatment, the silane coupling agent is applied to the exposed surfaces in a non-oxidative atmosphere, and the applied silane coupling agent is maintained in the non-oxidative atmosphere for about 2 hours. The resultant product is heated at about 110° C. for about 2 hours, and then cooled. As a result, the lyophobic parts 48, 50 can be formed on the surfaces as coatings constituted from the silane coupling agent.

Then, as shown in FIGS. 26A to 26C, the photoresist 82 is lifted off. Further, as shown in FIGS. 27A to 27C, the one surface of the substrate 24 is covered with a photoresist 84. Thus, the negative electrode collector 42 having the lyophobic part 48, the positive electrode collector 44 having the lyophobic part 50, the transmission membrane 14, the negative electrode active material 38, the positive electrode active material 40, and the spacers 11 are covered with the photoresist 84.

Figure 28A:
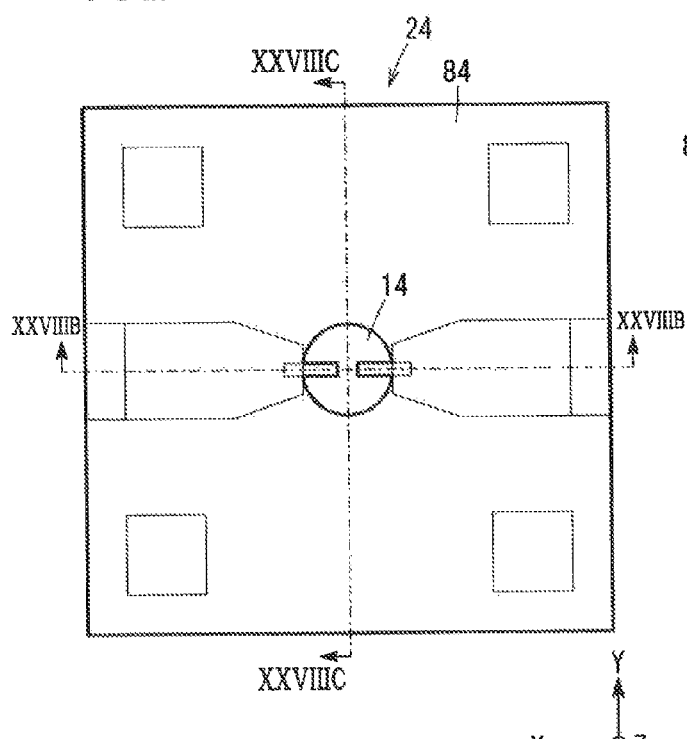
FIG. 28A is a plan view of a lyophilic part formation portion (formed on the transmission membrane) exposed by patterning the photoresist of FIG. 27A.
Figure 28C:
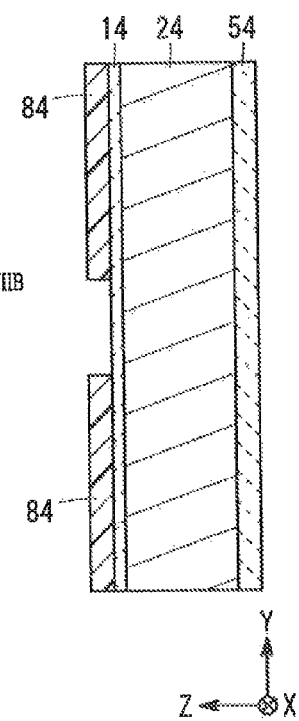
FIG. 28C is a cross-sectional view taken along line XXVIIIC-XXVIIIC of FIG. 28A in the direction of the arrows.
Figure 28B:
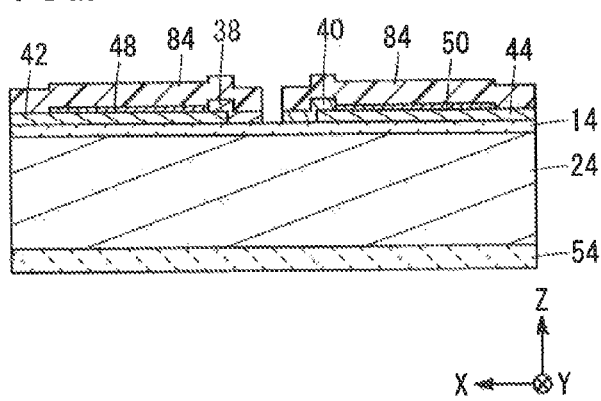
FIG. 28B is a cross-sectional view taken along line XXVIIIB-XXVIIIB of FIG. 28A in the direction of the arrows.

As shown in FIGS. 28A to 28C, the photoresist 84 is patterned by a photolithography process, such that a portion thereof, which corresponds to the lyophilic part 46 on the transmission membrane 14, is exposed. As shown in FIGS. 29A to 29C, the exposed surface of the transmission membrane 14 is subjected to a lyophilization treatment, whereby the lyophilic part 46 is formed.

During the lyophilization treatment, for example, Ar ion bombardment against the surface may be carried out under conditions of ordinary temperature, an Ar gas pressure of about 10 Pa, a plasma output of about 100 W, and an irradiation time of about 5 minutes. In the case that $O_2$ ions are used instead of Ar ions, the treatment may be carried out under conditions of an $O_2$ gas pressure of about 133 Pa, a plasma output of about 100 W, and an irradiation time of about 5 minutes. In this manner, the lyophilic part 46 preferably is formed by modifying the surface of the transmission membrane 14.

Figure 30A:
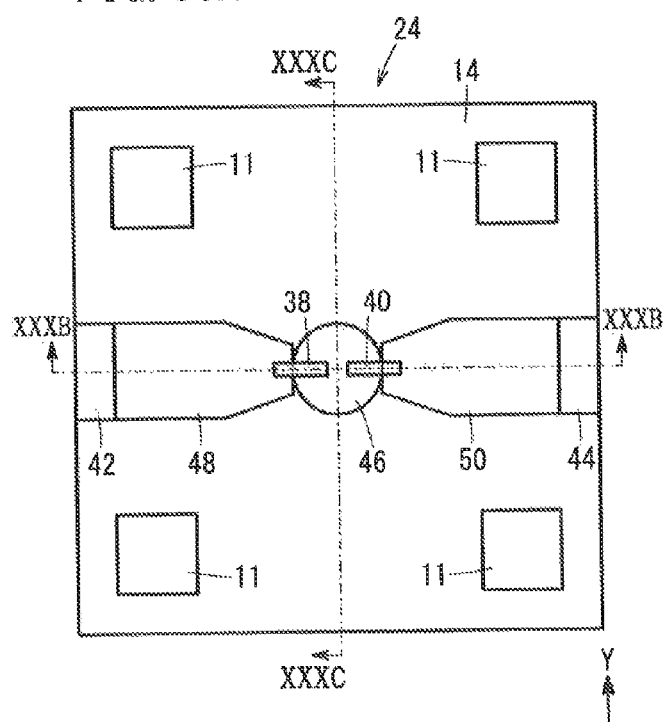
FIG. 30A is a plan view of the lyophilic part obtained by removing the photoresist of FIG. 29A.
Figure 30C:
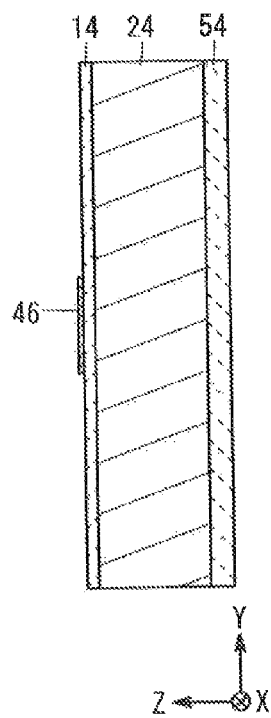
FIG. 30C is a cross-sectional view taken along line XXXC-XXXC of FIG. 30A in the direction of the arrows.
Figure 30B:
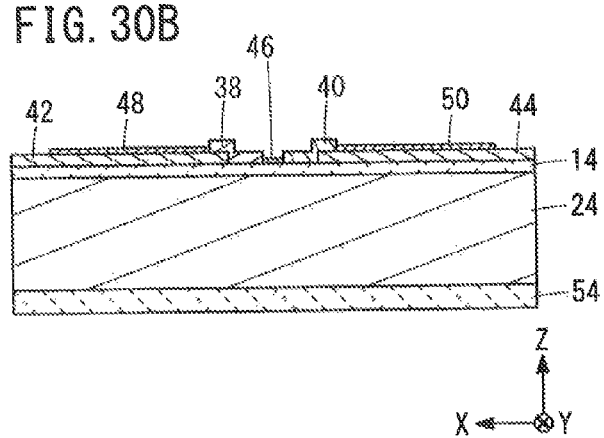
FIG. 30B is a cross-sectional view taken along line XXXB-XXXB of FIG. 30A in the direction of the arrows.

As shown in FIGS. 30A to 30C, the photoresist 84 is lifted off. As a result, the transmission membrane 14, the negative electrode collector 42 and the positive electrode collector 44 including the lyophobic parts 48, 50, the negative electrode active material 38 and the positive electrode active material 40, the lyophilic part 46 that is formed in the vicinity thereof, and the spacers 11 are arranged on the one surface of the substrate 24.

Figure 32A:
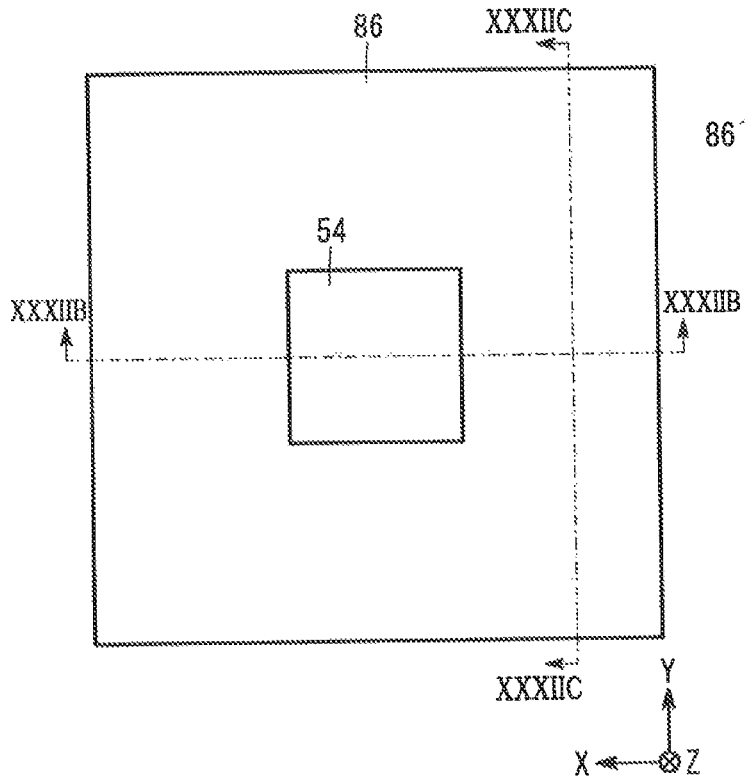
FIG. 32A is a plan view of an exposed portion in the covering membrane precursor, corresponding to an observation window, formed by patterning the photoresist of FIG. 31A.
Figure 32C:
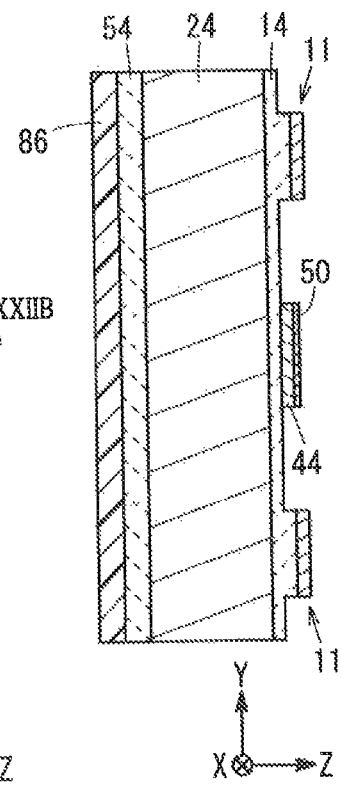
FIG. 32C is a cross-sectional view taken along line XXXIIC-XXXIIC of FIG. 32A in the direction of the arrows.
Figure 32B:
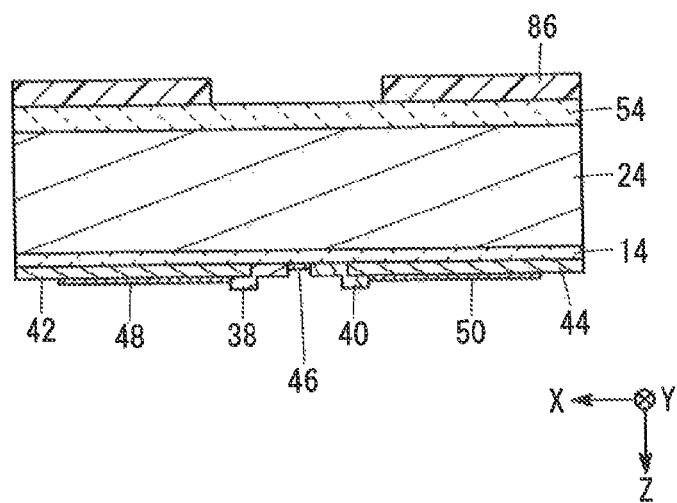
FIG. 32B is a cross-sectional view taken along line XXXIIB-XXXIIB of FIG. 32A in the direction of the arrows.

As shown in FIGS. 31A to 31C, the other surface of the substrate 24 having the covering membrane precursor 54 is covered with a photoresist 86. Then, as shown in FIGS. 32A to 32C, the photoresist 86 is patterned by a photolithography process, such that the covering membrane precursor 54 is exposed in a portion that corresponds to the through-hole 26 of the substrate 24.

Figure 34A:
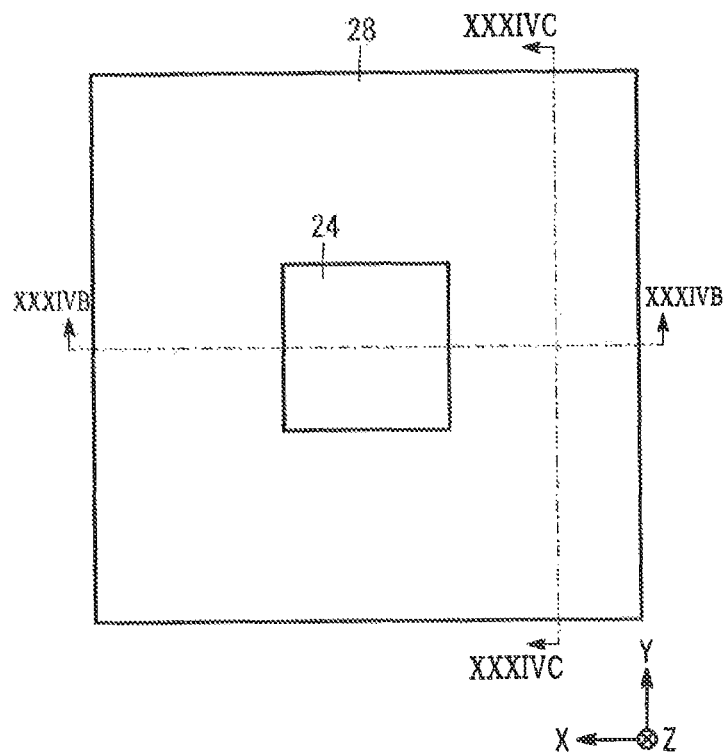
FIG. 34A is a plan view of a through-hole formation portion of the substrate exposed by removing the photoresist of FIG. 33A.
Figure 34C:
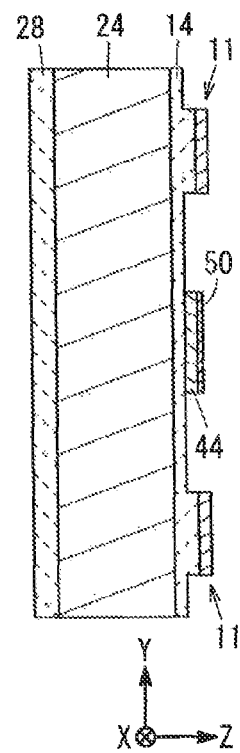
FIG. 34C is a cross-sectional view taken along line XXXIVC-XXXIVC of FIG. 34A in the direction of the arrows.
Figure 34B:
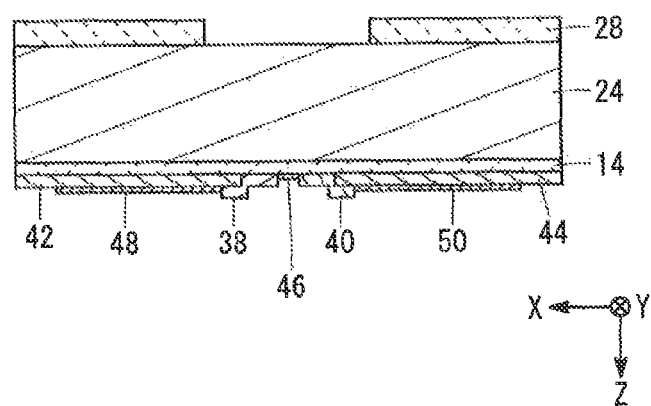
FIG. 34B is a cross-sectional view taken along line XXXIVB-XXXIVB of FIG. 34A in the direction of the arrows.

As shown in FIGS. 33A to 33C, a reactive ion etching process is carried out using the photoresist 86 as a mask. Thus, within the covering membrane precursor 54, the portion exposed in the photoresist 86 is removed from the substrate 24. In other words, in the substrate 24, a portion corresponding to the through-hole 26 is exposed. As shown in FIGS. 34A to 34C, the photoresist 86 is lifted off in order to obtain the covering membrane 28, and thereafter, the one surface of the substrate 24 is covered with an alkali-resistant surface protection layer (not shown).

Figure 35A:
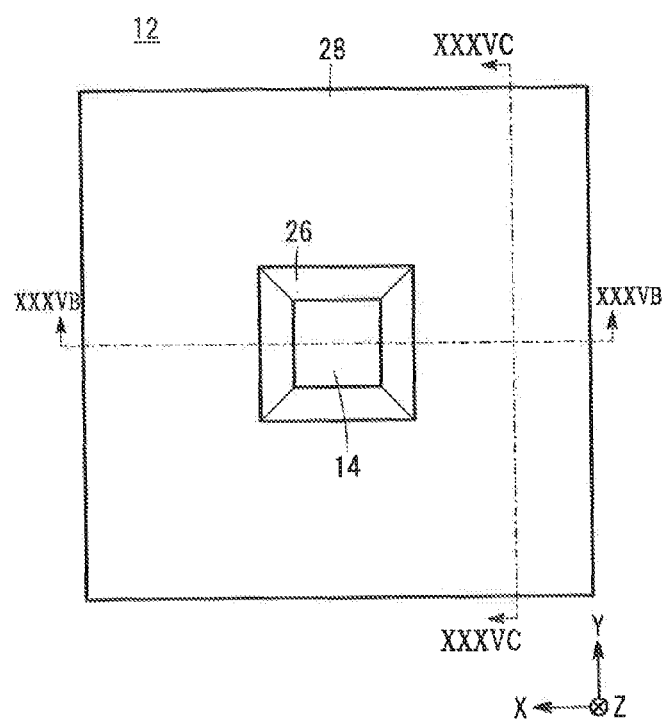
FIG. 35A is a plan view of a through-hole formed in the substrate of FIG. 34A.
Figure 35C:
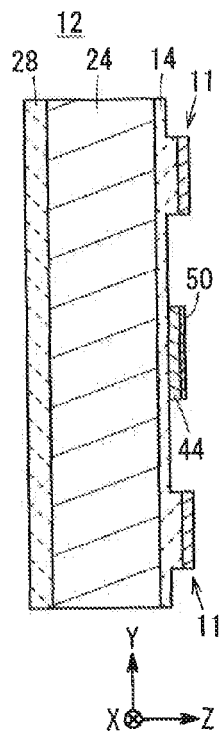
FIG. 35C is a cross-sectional view taken along line XXXVC-XXXVC of FIG. 35A in the direction of the arrows.
Figure 35B:
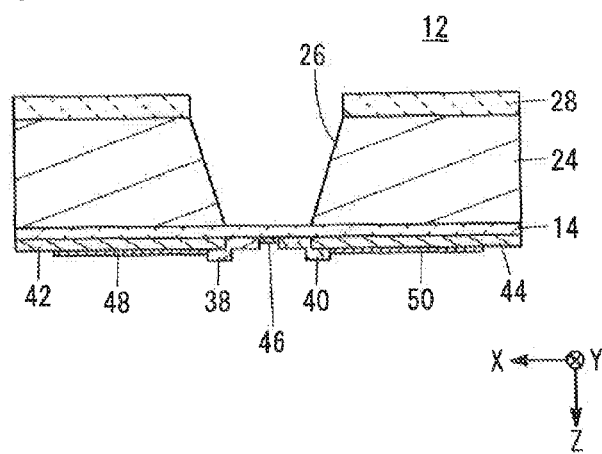
FIG. 35B is a cross-sectional view taken along line XXXVB-XXXVB of FIG. 35A in the direction of the arrows.

As shown in FIGS. 35A to 35C, the other surface of the substrate 24 is subjected to a penetration etching process in order to form the through-hole 26. During this process, the one surface of the substrate 24 is protected by the alkali-resistant surface protection layer. Then, a reactive ion etching process is carried out in order to remove the alkali-resistant surface protection layer, whereby the first holder 12 is obtained. The first holder 12 contains the substrate 24 having the through-hole 26. In addition, the transmission membrane 14 is disposed on the one surface of the substrate 24, such that one end of the through-hole 26 is covered with the transmission membrane 14.

During preparation of the second holder 16, both surfaces of the substrate 30 are polished in the same manner as the substrate 24, so as to be covered with the transmission membrane precursor 52 and the covering membrane precursor 54. The one surface of the substrate 30 is covered with a silicon nitride membrane, which is used as the transmission membrane 18, and the other surface is covered with a silicon nitride membrane, which is used as a covering membrane precursor. Then, the covering membrane 34 and the through-hole 32 are formed on the substrate 30 in the same manner as in the process used for forming the other surface of the substrate 24. Thus, the through-hole 32 is formed in the substrate 30, and the transmission membrane 18 is disposed on the one surface of the substrate 30, such that one end of the through-hole 32 is covered with the transmission membrane 18. In this manner, the second holder 16 is prepared.

After the first holder 12 and the second holder 16 have been prepared as described above, the electrolytic solution is applied to the one surface of the first holder 12, in such a manner that the negative electrode active material 38 and the positive electrode active material 40 are both brought into contact with the electrolytic solution. As described above, the second holder 16 is stacked on the first holder 12. Thus, the first holder 12 and the second holder 16 are stacked so as to form the overlapping portion 20, in such a manner that the through-holes 26, 32 face toward each other across the transmission membranes 14, 18 in order to form the observation window 36. During this process, at each end of the first holder 12, a portion having the width L protrudes from the overlapping portion 20.

Then, the sealant 22 is applied around the overlapping portion 20, whereby the inner space of the overlapping portion 20, which is filled with the electrolytic solution, is sealed. During the process of applying the sealant 22, the metal wires are fixed and electrically connected to the exposed portions of the negative electrode collector 42 and the positive electrode collector 44, which protrude from the overlapping portion 20. In this manner, the analytical cell 10 can be obtained. Thus, the analytical cell 10 can be produced more easily and at a lower cost by a known semiconductor process, as opposed to using an ion beam deposition method or the like.

In the analytical cell 10, which is produced in the foregoing manner, the lyophobic parts 48, 50 can be disposed respectively on the surfaces of the negative electrode collector 42 and the positive electrode collector 44, as described above. Furthermore, the lyophilic part 46 can be disposed in the vicinity of the negative electrode active material 38 and the positive electrode active material 40.

Therefore, side reactions, which are different from the analysis subject electrode reactions, can be suppressed on the surfaces of the negative electrode collector 42 and the positive electrode collector 44, and products of such side reactions can be prevented from becoming attached to the surfaces of the negative electrode collector 42 and the positive electrode collector 44. Meanwhile, electrode reactions of the negative electrode active material 38 and the positive electrode active material 40 can effectively be carried out. Consequently, the electrode reactions can be analyzed with high accuracy.

In addition, as described above, the negative electrode active material 38, the negative electrode collector 42, the positive electrode active material 40, and the positive electrode collector 44 are all formed on the transmission membrane 14 of the first holder 12. In this case, during production of the analytical cell 10, the steps of forming the negative electrode collector 42 and the positive electrode collector 44, forming the lyophobic parts 48, 50, and forming the lyophilic part 46 can be carried out using only the first holder 12. Therefore, the analytical cell 10 can be obtained easily and efficiently using a simple production process.

Second Embodiment

Figure 36:
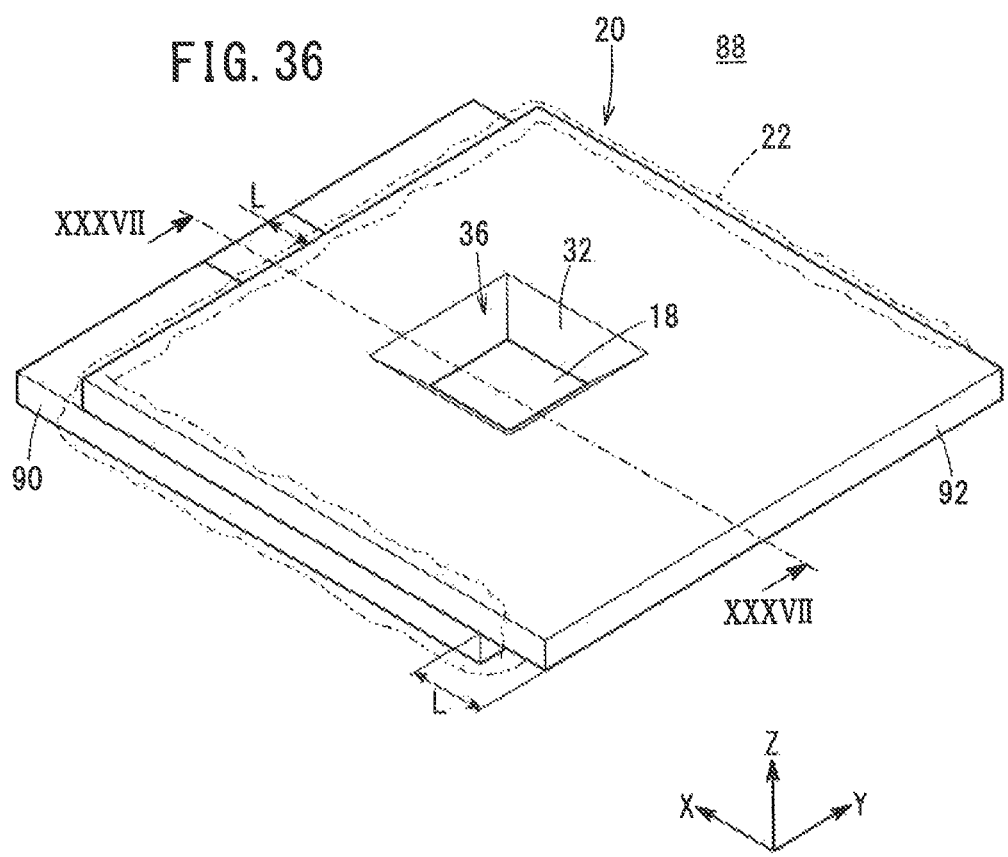
FIG. 36 is an overall schematic perspective view of an analytical cell according to a second embodiment of the present invention.
Figure 37:
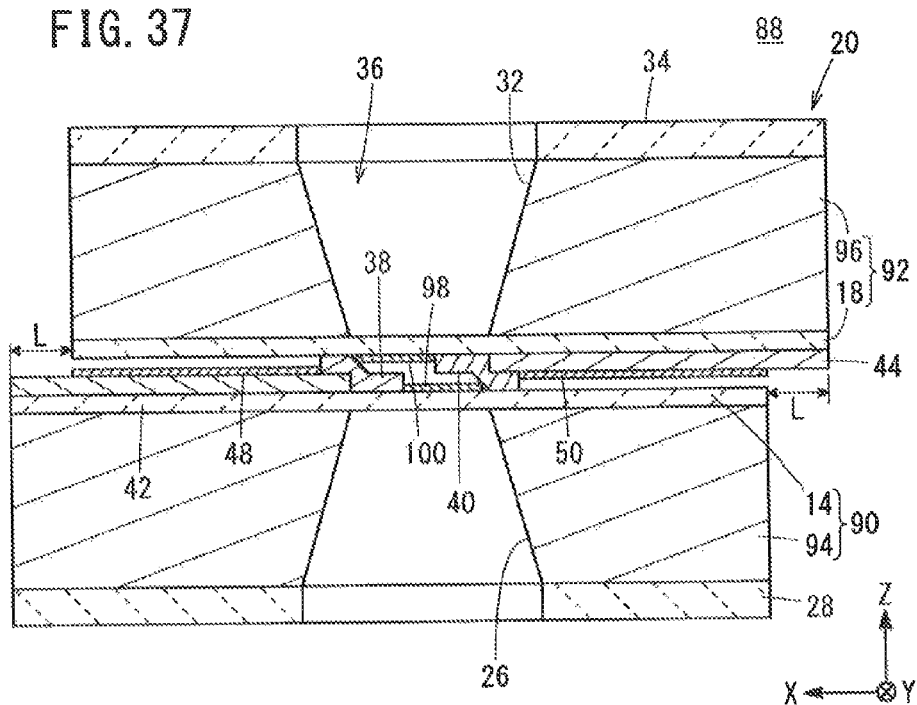
FIG. 37 is a cross-sectional view of the analytical cell taken along line XXXVII-XXXVII of FIG. 36 in the direction of the arrows.
Figure 38:
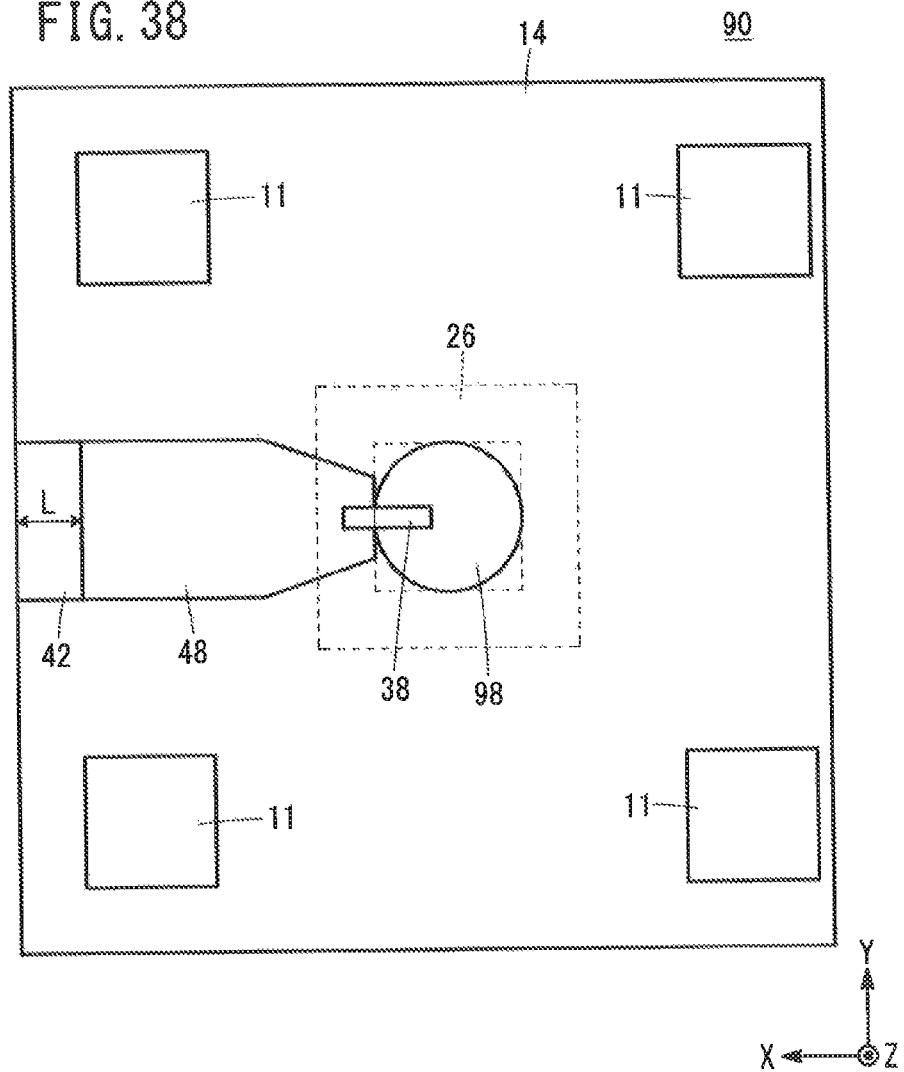
FIG. 38 is a plan view of a transmission membrane side of a first holder in the analytical cell of FIG. 36.

An analytical cell 88 according to a second embodiment will be described below with reference to FIGS. 36 to 39. FIG. 36 is an overall schematic perspective view of the analytical cell 88. FIG. 37 is a cross-sectional view of the analytical cell 88 taken along line XXXVII-XXXVII of FIG. 36 in the direction of the arrows. FIG. 38 is a plan view of a transmission membrane 14 side of a first holder 90 in the analytical cell 88. FIG. 39 is a plan view of a transmission membrane 18 side of a second holder 92 in the analytical cell 88. The components shown in FIGS. 36 to 39, which have equal or similar functions and effects to those shown in FIGS. 1 to 35C, are denoted by the same reference numerals, and detailed explanations of such features are omitted.

The analytical cell 88 contains the first holder 90 and the second holder 92, instead of the first holder 12 and the second holder 16 that are used in the analytical cell 10. Further, the first holder 90 contains a substrate 94 instead of the substrate 24, and the second holder 92 contains a substrate 96 instead of the substrate 30.

The substrate 94 differs from the substrate 24 in that the through-hole 26 is shifted slightly from the center of the substrate 94 toward one end in the width direction. The substrate 96 differs from the substrate 30 in that the substrate 96 has approximately the same shape as the substrate 94 in the first holder 90.

As described above, the first holder 90 and the second holder 92 are stacked so as to form the overlapping portion 20, in such a manner that the through-holes 26, 32 in the substrates 94, 96 face toward each other across the transmission membranes 14, 18. Therefore, in the analytical cell 88, one end of the first holder 90 and the other end of the second holder 92 protrude from the overlapping portion 20 in the width direction, respectively, thereby forming exposed portions having the width L.

In the analytical cell 88, the negative electrode active material 38 and the negative electrode collector 42 are formed on the transmission membrane 14 in the first holder 90, whereas the positive electrode active material 40 and the positive electrode collector 44 are formed on the transmission membrane 18 in the second holder 92. On the surface of the negative electrode collector 42, which is not in contact with the transmission membrane 14, the lyophobic part 48 is formed in a portion that is held in contact with the electrolytic solution inside of the overlapping portion 20. On the surface of the positive electrode collector 44, which is not in contact with the transmission membrane 18, the lyophobic part 50 is formed in a portion that is held in contact with the electrolytic solution inside of the overlapping portion 20.

A lyophilic part 98 is formed in the vicinity of the negative electrode active material 38 on the transmission membrane 14, in the same manner as the lyophilic part 46. Furthermore, a lyophilic part 100 is formed in the vicinity of the positive electrode active material 40 on the transmission membrane 18, in the same manner as the lyophilic part 46.

When the negative electrode active material 38 and the positive electrode active material 40 are formed on different holders (the first holder 90 and the second holder 92), the negative electrode active material 38 and the positive electrode active material 40 are not arranged excessively close to each other, and the negative electrode active material 38 and the positive electrode active material 40 are not in contact with each other.

Consequently, the analytical cell 88 has the same advantageous effects as the analytical cell 10, while in addition, the analytical cell 88 is capable of effectively preventing short-circuiting of the negative electrode active material 38 and the positive electrode active material 40, even when the negative electrode active material 38 and the positive electrode active material 40 are arranged in a small space.

The analytical cell 88 may be produced in the same manner as the above analytical cell 10, for example, except for using the substrate 96 instead of the substrate 94 during the steps of forming the positive electrode active material 40, the positive electrode collector 44, the lyophilic part 100, and the lyophobic part 50. As a result, in the analytical cell 88 as a final product, the negative electrode active material 38 and the positive electrode active material 40 are formed on different holders (the first holder 90 and the second holder 92).

The present invention is not limited to the above embodiments. Various changes and modifications may be made to the embodiments without departing from the scope of the invention as set forth in the appended claims.

For example, in the analytical cells 10, 88 of the above embodiments, the lyophobic parts 48, 50 are formed on the negative electrode collector 42 and the positive electrode collector 44, respectively. However, the present invention is not limited to this feature. Only one of the negative electrode collector 42 and the positive electrode collector 44 may include the lyophobic part 48 or the lyophobic part 50.

In the analytical cell 10 of the above embodiment, the lyophilic part 46 is formed in the vicinity of the negative electrode active material 38 and the positive electrode active material 40. Further, in the analytical cell 88, the lyophilic parts 98, 100 are formed respectively in the vicinity of the negative electrode active material 38 and the positive electrode active material 40. However, the present invention is not limited to this feature. The lyophilic part may be formed in the vicinity of at least one of the negative electrode active material 38 and the positive electrode active material 40. In addition, formation of the lyophilic parts 46, 98, 100 in the analytical cells 10, 88 is not essential.

In the case that the analytical cell 10 or the like of the above embodiment is not a lithium-ion secondary cell but a nickel-hydrogen cell, for example, a positive electrode of nickel hydroxide, a negative electrode of a hydrogen storing alloy, and an electrolytic solution of an aqueous potassium hydroxide solution KOH(aq) may be used. In the case that the analytical cell 10 is an alkaline-manganese cell, for example, a positive electrode of manganese dioxide/graphite, a negative electrode of zinc, and an electrolytic solution of KOH(aq) may be used.

The analytical cell 10 and the like can be used for performing an analysis not only in association with a TEM, but also in all types of analytical equipment that make use of electron beams.

What is claimed is:

1. An analytical cell through which an electron beam is transmitted to perform an analysis, comprising a first holder and a second holder stacked with an electrolytic solution interposed therebetween, wherein:

the first holder and the second holder each contain a substrate including a through-hole and a transmission membrane having an electron beam permeability, the through-hole extends in a thickness direction of the substrate, and the transmission membrane is disposed on one surface of the substrate such that one end of the through-hole is covered with the transmission membrane;

the first holder and the second holder are stacked to form an overlapping portion such that the surfaces of the substrates with the transmission membranes formed thereon face toward each other;

in the overlapping portion, an inner space containing the electrolytic solution is sealed, and the through-holes face toward each other across the transmission membranes in order to form an observation window through which an electron beam is transmitted;

a negative electrode active material and a positive electrode active material are arranged at a distance from each other, and are in contact, respectively, with the electrolytic solution between the transmission membranes in the observation window;

the negative electrode active material and the positive electrode active material are connected electrically to a negative electrode collector and a positive electrode collector, respectively, in the overlapping portion;

the negative electrode collector and the positive electrode collector each extend from inside of the overlapping portion and are exposed to outside; and a lyophobic part having no affinity for the electrolytic solution is formed on at least one of the negative electrode collector and the positive electrode collector.

2. The analytical cell according to claim 1, wherein the negative electrode active material, the negative electrode collector, the positive electrode active material, and the positive electrode collector are formed on the transmission membrane in the first holder.

3. The analytical cell according to claim 1, wherein:

the negative electrode active material and the negative electrode collector are formed on the transmission membrane in the first holder; and the positive electrode active material and the positive electrode collector are formed on the transmission membrane in the second holder.

4. The analytical cell according to claim 1, wherein a lyophilic part having an affinity for the electrolytic solution is formed in vicinity of at least one of the negative electrode active material and the positive electrode active material on a surface in contact with the electrolytic solution of the transmission membrane.

* * * * *